United States Patent [19]

Garg et al.

[11] Patent Number: 4,874,642
[45] Date of Patent: Oct. 17, 1989

[54] METHOD FOR DEPOSITING A HARD, FINE-GRAINED, NON-COLUMNAR ALLOY OF TUNGSTEN AND CARBON ON A SUBSTRATE

[75] Inventors: Diwaker Garg, Macungie, Pa.; Beth A. Klucher, Sherman Oaks, Calif.; Paul N. Dyer, Allentown, Pa.; Richard W. Kidd, Newhall, Calif.; Christopher Ceccarelli, Whitehall, Pa.

[73] Assignee: Air Products and Chemicals, Inc., Allentown, Pa.

[21] Appl. No.: 92,809

[22] Filed: Sep. 3, 1987

[51] Int. Cl.$^4$ .............................................. C23C 16/32
[52] U.S. Cl. ................................... 427/249; 427/255; 427/255.2
[58] Field of Search ............... 427/249, 253, 255.1, 427/255.2, 255, 255.3

[56] References Cited

U.S. PATENT DOCUMENTS

| | | | |
|---|---|---|---|
| 3,230,110 | 1/1966 | Smith | 427/249 |
| 3,368,914 | 2/1968 | Darnell et al. | 427/249 |
| 3,389,977 | 6/1968 | Tarver | 427/249 |
| 3,574,672 | 4/1971 | Tarver | 427/249 |
| 3,721,577 | 3/1973 | Woerner | 427/249 |
| 3,814,625 | 6/1974 | Lewin et al. | 427/249 |
| 4,147,820 | 4/1979 | Holzl | 427/249 |
| 4,162,345 | 7/1979 | Halzl | 428/328 |
| 4,427,445 | 1/1984 | Holzl | 75/234 |
| 4,741,975 | 5/1988 | Naik et al. | 428/621 |

FOREIGN PATENT DOCUMENTS

| | | | |
|---|---|---|---|
| 54-21409 | 2/1979 | Japan | 427/249 |
| 61-157681 | 7/1986 | Japan | 427/249 |
| 1326769 | 10/1970 | United Kingdom | 427/249 |
| 1540718 | 3/1975 | United Kingdom | 427/249 |

Primary Examiner—Sadie Childs
Attorney, Agent, or Firm—Richard A. Dannells, Jr.; William F. Marsh, Jr.; James C. Simmons

[57] ABSTRACT

A method for producing the disclosed material comprises introducing into a chemical vapor deposition (CVD) reactor a mixture of process gases comprised essentially of (1) tungsten hexafluoride, (2) a volatile oxygen- and hydrogen-containing organic compound, and (3) hydrogen; controlling the ratio of the tungsten hexafluoride to the oxygen- and hydrogen-containing organic compound within the CVD reactor so that the W/C atomic ratio is within the range of about 0.5 to about 15; controlling the reaction temperature so it is within the range of above about 300° to less than about 650° C.; controlling the total pressure within the range of about 1 Torr. to about 1,000 Torr.; and controlling the ratio of $H_2$ to $WF_6$ within the range of about 4 to about 20; to produce W and $W_2C$, W and $W_3C$, or W and $W_2C$ and $W_3C$.

28 Claims, 12 Drawing Sheets

COLUMNAR TUNGSTEN COATING

Ni LAYER

AM-350 STAINLESS STEEL

W+W₃C COATING
Ni LAYER
AM-350 STAINLESS STEEL

METHOD FOR DEPOSITING A HARD, FINE-GRAINED, NON-COLUMNAR ALLOY OF TUNGSTEN AND CARBON ON A SUBSTRATE

FIELD OF THE INVENTION

This invention relates to high hardness fine grained tungsten-carbon alloys and to a process for producing the same.

BACKGROUND OF THE INVENTION

High hardness materials are widely used as coatings on various types of mechanical components and cutting tools. Such coatings impart wear and erosion resistance and thus increase the wear and erosion life of objects that have been coated. The high hardness materials can also be used to produce free standing objects which are wear resistant.

Chemical vapor deposition processes can be used to produce high hardness coatings and high hardness free standing objects. In a typical chemical vapor deposition (CVD) process the substrate to be coated is heated in a suitable chamber and then a gaseous reactant mixture is introduced into the chamber. The gaseous reactant mixture reacts at the surface of the substrate to form a coherent layer of the desired coating. By varying the gaseous reactant mixture and the CVD process parameters, various types of deposited coatings can be produced.

Deposits produced by chemical vapor deposition, both for coating substrates and for producing free standing objects, have suffered certain drawbacks. Although the hardness of the deposits has been satisfactory, the strength and toughness of the materials has often been lower than desired. This lack of strength and toughness is due in large part to the grain size, crystallite size, and structure of the compounds that make up the deposit. Unfortunately, regardless of the components of the gaseous reactant mixture, typical CVD techniques produce coatings having relatively large grains which are arranged in columns. Thus, cross-sectional metallographic examination of a typical chemical vapor deposition deposit will show grains usually in excess of several microns in size which are arranged in columns that extend perpendicularly to the substrate surface. Such deposits are typically quite brittle since adjacent columns of grains result in long interstitial regions of weakness. Such regions are easily fractured and attacked by corrosive agents and erosive media. Because of the columnar grain structure, such deposits also have poor surface finish and poor wear and erosion resistance properties.

Robert A. Holzl, U.S. Pat. No. 4,162,345, issued July 24, 1979 discloses a method for producing deposits of tungsten and carbon or molybdenum and carbon which results in deposits characterized by a structure which is free of columnar grains and instead consists essentially of fine, equiaxial grains. These deposits have unusually high hardness and tensile strength. The Holzl patent discloses use of temperatures varying from 650° C. to 1,100° C., which are high enough to severely degrade the mechanical properties of various carbon steels, stainless steels, nickel alloys, titanium alloys and cemented carbide.

In the method of the Holzl '345 patent, a sequence of events is made to take place which, although similar to conventional chemical vapor deposition, is not truly that. The Holzl method employs a reactor which is essentially similar to a chemical vapor deposition reactor. However, according to the Holzl method the apparatus is operated in such a manner that the typical chemical vapor deposition process does not take place. Typical chemical vapor deposition involves a single reaction by the gases in the reactor at the surface of the substrate resulting in the formation of a solid phase deposit directly on the substrate surface. On the other hand, the Holzl '345 patent describes a deposition process involving at least two distinct reaction steps. According to the Holzl method, an initial reaction is caused to take place displaced from the surface of the substrate. This reaction involves a decomposition or partial reduction of a fluoride of tungsten (preferably $WF_6$) by a substitution reaction with an oxygen or oxygen-containing group derived from a gaseous organic compound containing hydrogen, carbon and oxygen. Subsequent reaction with hydrogen gas results in the formation of the final deposits. The material of the Holzl '345 patent is a hard metal alloy, consisting primarily of tungsten and carbon. X-ray diffraction analysis of the '345 alloy shows that the deposit is akin to tungsten but with a very finely dispersed carbide, probably in the form WC.

Robert A. Holzl, et al, U.S. Pat. No. 4,427,445, issued January 24, 1984 also discloses a hard fine grained material which can be produced by thermochemical deposition, but at temperatures lower than those described in the examples of the '345 patent. Thus, where there are large differences in the thermal coefficients of expansion between the substrate material and the coating material, the '445 methodology reduces adhesion problems and problems associated with mechanical distortion, metallurgical transformation or stress relief of the substrate. The material of the '445 Holzl, et al. patent is a tungsten carbon alloy consisting primarily of a two phase mixture of substantially pure tungsten and an A15 structure.

U.S. Pat. No. 3,368,914, discloses a process for adherently depositing tungsten carbide of substantial thickness on steel and other metal substrates. The process involves first diffusing another metal on the surface of the substrate to relax the thermal expansion coefficient zone of the metal substrate. The carbide coating is then deposited on the diffused surface by CVD. The process claims it is preferably to diffuse the metal forming the carbide into the substrate. In one embodiment of the claimed process, a thin layer of W is deposited on the metal surface using 600°–1000° C. temperature. After coating W, the temperature is increased to approximately 1000°–1200° C. and held there for a significant period of time to permit diffusion of W into the metal. The diffused surface is then coated with tungsten carbide using $WF_6$, CO and $H_2$. In the alternative embodiment, a pack diffusion technique is used for achieving diffusion of W into metal. Temperature ranging from 1000°–1200° C. is used in the pack diffusion step. The diffused metal surface is then coated with tungsten carbide.

U.S. Pat. No. 3,389,977, discloses a method of depositing substantially pure tungsten carbide in the form of $W_2C$, free from any metal phase. Pure $W_2C$ is deposited on a substrate by reacting $WF_6$ and CO. The substrate is heated to a temperature in excess of 400° C. The adherence of $W_2C$ to steel is improved by first cleaning the surface and then depositing with a thin film of W followed by $W_2C$ using a temperature ranging from 600°–1000° C. Since initial deposition of tungsten is conducted at or above 600° C., the '977 process is not feasible for providing erosion and wear resistance coating on various carbon steels, stainless steels, nickel and titanium alloys without severely degrading their mechanical properties. Additionally pure $W_2C$ deposited according to the teachings of the '977 patent consists of columnar grains. The '977 patent does not describe a process for depositing $W_2C$ coating in non-columnar fashion.

U.S. Pat. No. 3,574,672 discloses a process for depositing $W_2C$ by heating a substrate to a temperature between 400°–1300° C. The process described in this patent is essentially the same as disclosed in U.S. Pat. No. 3,389,977.

U.S. Pat. No. 3,721,577 discloses a process for depositing refractory metal or metal carbides on ferrous and non-ferrous base materials heated to at least 1050° C. The metal carbides are deposited using halide vapors of the metal along with methane and hydrogen.

U.S. Pat. No. 3,814,625 discloses a process for the formation of tungsten and molybdenum carbide by reacting a mixture of $WF_6$ or $MoF_6$, benzene, toluene or xylene and hydrogen. The process is carried out under atmospheric pressure and temperatures ranging from 400°–1000° C. An atomic ratio of W/C in the gaseous mixture varying from 1 to 2 is required to yield $W_2C$. The process also suggests that for some substrates such as mild steel, it is advantageous in providing better adhesion to deposit a layer of nickel or cobalt prior to tungsten carbide deposition. The process also claims the formation of a mixture of tungsten and tungsten carbide in the presence of large proportions of free hydrogen. The mixture of W and $W_2C$ coating deposited according to the teaching of the '625 patent consists of columnar grains. The '625 patent does not disclose a process for depositing a mixture of W and $W_2C$ in non-columnar fashion.

British Pat. No. 1,326,769 discloses a method for the formation of tungsten carbide by reacting a mixture of $WF_6$, benzene, toluene or xylene and hydrogen under atmospheric pressure and temperatures ranging from 400°–1000° C. The process disclosed in this patent is essentially the same as disclosed in U.S. Pat. No. 3,814,625.

British Pat. No. 1,540,718 discloses a process for the formation of $W_3C$ using a mixture of $WF_6$, benzene, toluene or xylene and hydrogen under sub-atmospheric pressure and temperature ranging from 350°–500° C. An atomic ratio of W/C in the gaseous mixture varying from 3–6 is required to yield $W_3C$. The coating deposited according to the teaching of British Pat. No. 1,540,718 consists of columnar grains. The British '718 patent does not teach a process for depositing a non-columnar coating.

Although the methods of the Holzl patents cited above have been useful in producing fine-grained tungsten/carbon alloys containing mixtures of W and WC, and W and A15 structure, and the methods described in other cited patents have been successful in producing columnar $W_3C$ or $W_2C$ or mixtures of W and $W_2C$, no one has yet disclosed a method for producing extremely hard, fine-grained and non-columnar tungsten-carbon alloys containing mixtures of tungsten and true carbides in the form of $W_2C$ or $W_3C$ or a mixture of $W_2C$ and $W_3C$. Such alloys would be especially useful since the presence of the $W_2C$ and/or $W_3C$ carbides in non-columnar microstructure would contribute to both the hardness and the tensile strength of the deposited materials.

FIGURES

SUMMARY OF THE INVENTION

Figure 1:
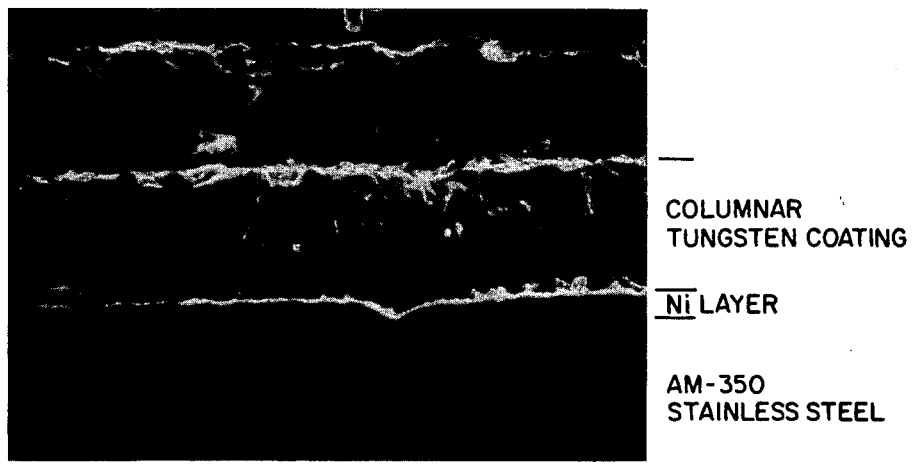
FIG. 1 is a photomicrograph of an etched cross-section of tungsten coating on AM-350 stainless steel.

The invention discloses hard, fine-grained, non-columnar, substantially lamellar tungsten-carbon alloys consisting essentially of a mixture of a substantially pure tungsten phase and a carbide phase, wherein the carbide phase is $W_2C$ or $W_3C$, or a mixture of $W_2C+W_3C$. The invention also discloses a chemical vapor deposition like method for producing the disclosed alloys. According to the method, the alloys are deposited thermochemically on a substrate under sub-atmospheric pressure to slightly atmospheric, i.e. within the range of about 1 Torr. to about 1000 Torr., at a temperature of about 300° to about 650° C., using a mixture of process gases comprising a tungsten halide, hydrogen, and an oxygen- and hydrogen-containing organic compound.

Tungsten carbon alloys containing $W+W_2C$, $W+W_3C$, or $W+W_2C+W_3C$ can be formed using a wide range of process conditions. In addition the microstructure, composition, properties, and crystallite size of the new alloys can be controlled by manipulating the process parameters used to make the alloys. More specifically, by conjunctively controlling various interdependent operating parameters, especially the reaction temperature within the range of about 300° to about 650° C., the feed rate of tungsten halide to the oxygen- and hydrogen- containing organic compound to control the W/C atomic ratio within the range from about 0.5 to about 15.0, and the ratio of hydrogen to tungsten halide to more than a stoichiometric amount required from the reduction of tungsten halide, preferably within the range of about 4 to about 20, and more preferably within the range of about 5 to about 10, it is possible to produce a tungsten carbide alloy containing a carbide phase comprised either of $W+W_2C$ or $W+W_3C$ or a mixture of $W+W_2C+W_3C$. Regardless of the composition of the carbide phase, according to the method of the invention, the reaction mixture contains more than a stoichiometric amount of $H_2$ required for reduction of the tungsten halide to produce $W+W_2C$, $W+W_3C$, or $W+W_2C+W_3C$.

The new tungsten carbon alloys of the present invention consist of a mixture of $W+W_2C$, $W+W_3C$, or $W+W_2C+W_3C$ phases. These alloys are unexpectedly found to have non-columnar grains and a lamellar microstructure. The new alloys' hardness values can be manipulated by altering process conditions.

DETAILED DESCRIPTION OF THE INVENTION

The present invention discloses new non-columnar tungsten carbon alloys consisting essentially of a mixture of a substantially pure tungsten phase and a carbide phase wherein the carbide phase can be comprised of $W_2C$, $W_3C$, or a mixture of $W_2C+W_3C$. Unlike alloys of the prior art that are produced by conventional vapor deposition techniques, the tungsten carbon alloys of the present invention are comprised of extremely fine equiaxial grains which average about one micron or less in size. In cross-section, the alloys of the present invention exhibit a well defined lamellar microstructure with layers less than about 2 micrometers thick. The alloys of the invention are essentially free of columnar grains and thus are more resistant to corrosion, wear and erosion than are prior art alloys composed of columnar grains.

The method of the present invention is based on the surprising discovery that deposits consisting of a mixture of a substantially pure tungsten phase and a carbide phase, consisting either of $W_2C$ or $W_3C$ or a mixture of $W_2C+W_3C$, in a fine grain, non-columnar microstructure can be produced by not only controlling the temperature of the reaction but also by controlling the W/C atomic ratio and the ratio of the hydrogen to tungsten halide which takes place in the initial tungsten halide substitution reaction. Since the various operating parameters can be interdependent, the operating parameters should be conjunctively controlled. As used herein the term "conjunctively controlled" means that the operating parameters as whole are controlled; in other words, the affect of a change in one parameter will be used in determining the operating values for the remaining parameters. For example, a change in the reaction temperature may necessitate a change in the ratio of tungsten halide to the oxygen- and hydrogen-containing organic compound.

Figure 10:
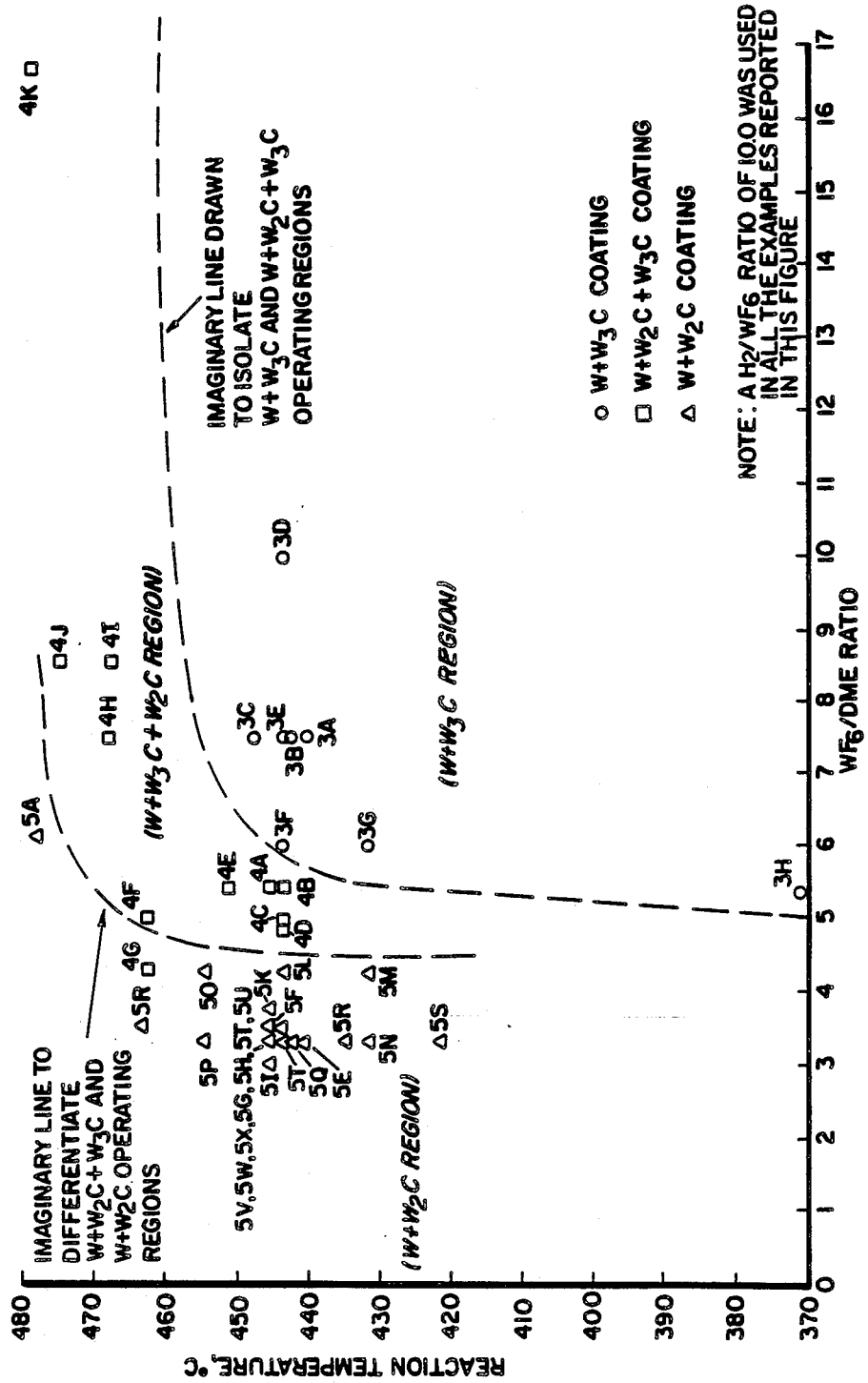
FIG. 10 is a graph showing the relationship between reaction temperature and $WF_6$/DME ratio.

By carefully selecting appropriate combinations of reaction temperature, the W/C atomic ratio and the ratio of hydrogen to tungsten halide, the composition of the carbide phase and the characteristics of the tungsten carbon alloy can be controlled. Additional refinement of the carbide phase can be made by producing the alloys in the presence or absence of a diluent or inert gas such as argon, nitrogen and helium. For example, FIG. 10 is a graphic representation of the processing and compositional data from Examples 3A-H through 5A-U, as tabulated in Tables 1 and 2. Using that data as guidelines, if one wishes to produce a tungsten carbon alloy having a carbide phase consisting of $W_2C$ and lamellar microstructure, this alloy can be produced at a reaction temperature ranging from 375°–475° C., using dimethyether (DME) as an oxygen- and hydrogen-containing organic compound with $WF_6$ as the tungsten halide, a W/C atomic ratio of less than about 4, for example within the range of about 1 to about 3.5 and a $H_2/WF_6$ ratio of about 10.

If one wishes to produce a tungsten carbon alloy having a carbide consisting of $W_3C$ and a substantially lamellar microstructure, this alloy can be produced at a reaction temperature ranging from 375°–475° C., using DME, $WF_6$, a W/C atomic ratio of about 2.5 to about 15 and a $H_2/WF_6$ ratio of about 10. Finally, if one wishes to produce such an alloy having a carbide phase consisting of a mixture of $W_2C$ and $W_3C$ and a substantially lamellar microstructure, this alloy can be produced at the same conditions except that the W/C atomic ratio is in the range of about 2 to about 10.

Using the teaching of the present invention, it will be readily apparent to those skilled in the art that, in these new tungsten carbon alloys, the composition of the carbide phase can be manipulated by changing, in a conjunctively controlled manner, the reaction temperature, the W/C atomic ratio, and the ratio of hydrogen to tungsten halide. Using the teaching of the present invention, such routine alteration of process parameters is now well within the skill of one skilled in the art, making it possible to utilize the broad teaching of the present invention to create custom tungsten carbon alloys having desired compositions and characteristics.

Turning now to preferred process conditions for making the tungsten carbon alloys of the present invention, with regard to pressure within the reaction vessel, preferred pressure is usually sub-atmospheric, down to 1 Torr., or up to slightly above atmospheric pressure, 1000 Torr.

With regard to the reaction temperature, temperatures of about 300° C. to about 650° C. are preferred; temperatures in the range of about 400° C. to about 450° C. are especially preferred.

With regard to the tungsten halide component of the reaction mixture, according to the method of the invention, tungsten fluorides are preferred. Tungsten hexafluoride ($WF_6$) is especially preferred.

With regard to the hydrogen gas component of the reaction mixture, it is essential for the deposition of the alloys to use more than a stoichiometric amount of hydrogen required for complete conversion of the tungsten fluoride (e.g., $WF_6$) to hydrogen fluoride (HF).

With regard to the oxygen- and hydrogen-containing organic compound, preferred compounds are selected from group consisting of $C_1$-$C_4$ alcohols and aldehydes, $C_2$-$C_4$ ethers, epoxides and ketenes and $C_3$-$C_4$ ketones, For example, methanol, formaldehyde, ethanol, dimethyl ether, ketene (carbomethane), acetaldehyde, ethylene oxide, vinyl alcohol, acetone, acrolein, allyl alcohol, methyl ethyl ether, isopropyl alcohol, n-propyl alcohol, propylene oxide, propene oxide, propiolaldehyde, propionaldehyde, 2-propyne-1-ol, 3-methoxy propyne, vinyl ether, diethyl ether, furan, tetrahydrofuran, crotonaldehyde, and α-methyl acrolein. Especially preferred is the two carbon and one oxygen-containing organic compound, dimethyl ether (DME).

Due to the interdependency of the various operating parameters it is to be expected that the operating range of the tungsten halide to oxygen-and hydrogen- containing organic compound ratio or W/C atomic ratio may change depending on the number of carbon atoms in the oxygen- and hydrogen-containing organic compound. For example, use of a compound such as methanol, with one carbon atom, would be expected to reduce the operating range of the tungsten halide to methanol ratio. On the other hand, use of a compound such as diethyl ether, which has four carbons, would be expected to increase the operating range of the tungsten halide to diethyl ether ratio.

The tungsten/carbon alloys of the present invention can be deposited on a number of ferrous metals and alloys such as cast iron, carbon steels, stainless steels and high speed steels, non-ferrous metals and alloys such as copper, nickel, platinum, rhodium, titanium, aluminum, silver, gold, niobium, molybdenum, cobalt, tungsten, rhenium, copper alloys, nickel alloys such as inconel and monel, titanium alloys such as Ti/Al/V, Ti/Al/Sn, Ti/Al/Mo/V, Ti/Al/Sn/Zn/Mo, Ti/Al/V/Cr, Ti/Mo/V/Fe/Al, Ti/Al/V/Cr/Mo/Zr and Ti/Al/V/Sn alloys, non-metals such as graphite, carbides such as cemented carbide, and ceramics such as silicon carbide, silicon nitride, alumina, etc. In depositing tungsten carbon alloys of the present invention on reactive substrate materials, such as cast irons, carbon steels, stainless steels, high speed steels, titanium and titanium alloys, aluminum and aluminum alloys, and nickel alloys, it is preferred to coat the substrate first with a more noble material such as nickel, cobalt, copper, silver, gold, platinum, palladium or iridium, by electrochemical or electroless techniques or by physical vapor deposition such as sputtering. However, no deposition of noble material is required for coating non-reactive materials such as copper, nickel, cobalt, silver, gold, platinum, rhodium, niobium, molybdenum, tungsten, rhenium, graphite, carbides and ceramics. Free standing parts of tungsten/carbon alloys of the present invention can be made by depositing the alloy on substrates such as copper, nickel, cobalt, silver, gold, molybdenum, rhenium, and graphite and then removing these substrates by grinding and chemical or electrochemical etching.

The deposits of the present invention are comprised of mixtures of $W+W_2C$, $W+W_3C$, and $W+W_2C+W_3C$. The deposits are characterized by a non-columnar crystal or grain structure consisting essentially of homogeneous fine and equiaxial grains having an average crystallite size of less than about 0.1 microns. This is in contrast to the typical columnar crystal habit of conventional chemical vapor deposition. Deposits made by the method of the present invention are essentially lamellar and have been found to have unusually high wear and erosion resistance and unexpected hardness.

The Examples which follow illustrate the wide range of operating parameters which can be used to create "customized" alloys having desired compositions and characteristics. As a control, Examples 1 and 2 illustrate production of prior art tungsten consisting of columnar grains. The non-columnar grain containing alloys of the present invention are illustrated in Examples 3–5. More specifically, Examples 3A–I illustrate production of tungsten carbon alloys having a carbide phase consisting of $W_3C$, i.e., a tungsten carbon alloy consisting of $W+W_3C$. Examples 4A–N illustrate production of tungsten carbon alloys having a carbide phase consisting of $W_2C+W_3C$, i.e., a tungsten carbon alloy consisting of $W+W_2C+W_3C$. Examples 5A–Z illustrate production of alloys having a carbide phase consisting of $W_2C$, i.e., a tungsten carbon alloy consisting of $W+W_2C$. The data in Examples 5Q to 5X also illustrate that a diluent such as argon can be used during the coating reaction to affect coating hardness without concomitantly affecting coating composition or crystallite size. The date in Examples 3I, 4L to 4N, and 5X to 5Z illustrate the effect of using different hydrogen to $WF_6$ ratio on coating composition. Example 6 illustrates that tungsten/carbon alloys can be deposited on cemented carbide without a protective layer of noble material. Examples 7 and 8 illustrate that tungsten/carbon alloys can be deposited on aluminum and titanium alloys with protective layer of noble materials. Example 9 illustrates the ceramic materials such as alumina can be deposited with tungsten/carbon alloys without a protective layer of noble materials. Examples 10 and 11 show that tungsten/carbon alloys can be deposited on molybdenum. Example 12 shows that a tungsten followed by tungsten/carbon alloy coatings can be deposited on various metals and alloys. Example 13 illustrates the erosion performance of some of the alloys of the present invention. Examples 14 and 15 illustrate the wear performance of tungsten/carbon alloy ($W+W_2C$) of the present invention. Finally, Examples 16 to 20 illustrate that several different oxygen-and-hydrogen containing organic compounds can be used to produce tungsten/carbon alloys.

Using the preferred tungsten halide, tungsten hexafluoride ($WF_6$), and the preferred oxygen- and hydrogen-containing organic compound, dimethyl ether (DME), the Examples also illustrate the best mode of making and using the present invention. The examples are for illustrative purposes only and are not meant to limit the scope of the claims in any way.

EXAMPLES FOR TUNGSTEN COATING

Example 1

Two 0.095 inch ×1 inch ×2 inch SIC-6 graphite and three AM-350 stainless steel specimens were placed in an inductively heated graphite furnace inside a gas-tight quartz envelope. Stainless steel specimens were electroplated with 3–5 μm thick nickel before coating operation to protect them from the attack of corrosive HF gas. The specimens were heated to 443° C. and a gaseous mixture of 300 cc/min of $WF_6$ and 3,000 cc/min of hydrogen was passed into the furnace over the specimens. The total pressure within the system was maintained at 40 Torr. The deposition was conducted for 40 minutes; thereafter, the flow of the reactive gases was stopped and the specimens were cooled.

Figure 2:
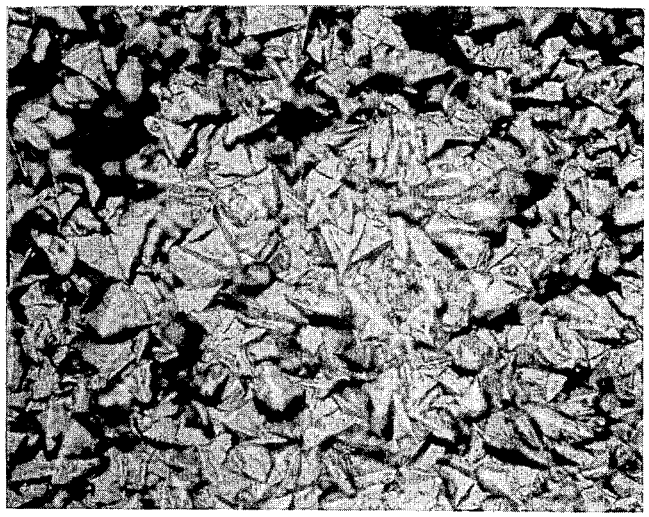
FIG. 2 is a photomicrograph of the surface of AM-350 stainless steel coated with tungsten.

The specimens were found to be coated with a dull, adherent, coherent, and non-uniform coating of 12 to 50 micrometers thick tungsten on each side (see Tables 1 and 2). The coating consisted of columnar grains as shown in FIG. 1. The coating had a very rough surface finish as shown in FIG. 2. The average surface finish of uncoated AM-350 stainless steel was 16 micro-inch; whereas, the average surface finish of the coated specimen was 36 micro-inch. This indicated that the coating degraded the surface finish of the specimen. The coating had a hardness of 510 and 465 Vickers on graphite and stainless steel specimens, respectively.

Example 2

A number of AM-350 and SS-422 stainless steel and IN-718 specimens (0.095 inch ×1 inch ×2 inch) electroplated with 3–4 μm thick layer of either nickel or copper using electrolytic technique were placed in the furnace similar to that described in Example 1. The specimens were heated to 443° C. and a gaseous mixture of 300 cc/min of WF$_6$, 3,000 cc/min of hydrogen, and 4,000 cc/min of argon was passed into the furnace over the specimens. The total pressure within the system was the same as in Example 1. The deposition, however, was conducted only for 15 minutes; thereafter, the flow of the reactive gases was stopped and the specimens were cooled.

All the specimens were coated with a dull, adherent, coherent, and uniform coating of 10–12 μm thick tungsten on each side. The coating consisted of columnar grains and had rough surface finish. The average surface finish of the uncoated AM-350 stainless steel was 16 micro-inch; whereas, the average surface finish of the coated specimen was 18 micro-inch. This indicated that the degradation of surface finish by tungsten coating could be controlled by carefully selecting the process conditions. The hardness of tungsten coating varied between 455 to 564 Vickers, as shown in Table 1.

This Example shows that both nickel and copper interlayers can be used to protect the reactive substrate from the attack of hot HF gas.

EXAMPLES FOR TUNGSTEN CARBON ALLOY (W+W$_3$C) COATING

Example 3A

In this Example, several specimens of SIC-6 graphite and nickel plated AM-350 stainless steel were coated simultaneously in a single run. All the specimens were 0.093 inches thick, 1 inch wide, and 2 inches long. The specimens were heated to a temperature of about 440° C. and a gaseous mixture of 300 cc/min WF$_6$, 3,000 cc/min of hydrogen and 40 cc/min of DME was passed into the furnace over the specimens. A WF$_6$/DME ratio of 7.5 or W/C atomic ratio of 3.75 and a H$_2$/WF$_6$ ratio of 10.0 were maintained throughout the run. The total pressure was maintained at 40 Torr. to provide a DME partial pressure of 0.48 Torr., as shown in Table 1. The deposition was conducted for 40 minutes.

Figure 3:
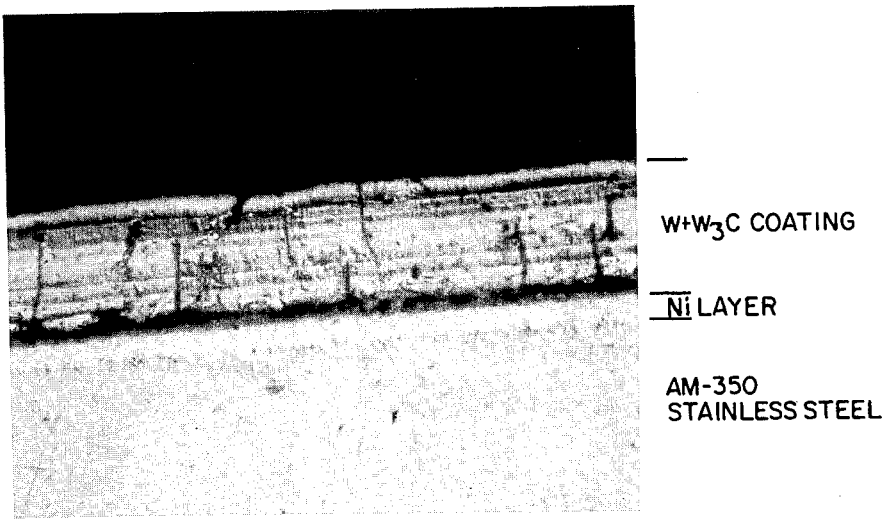
FIG. 3 is an etched cross-sectional photomicrograph of $W+W_3C$ coating on AM-350 stainless steel.
Figure 4:
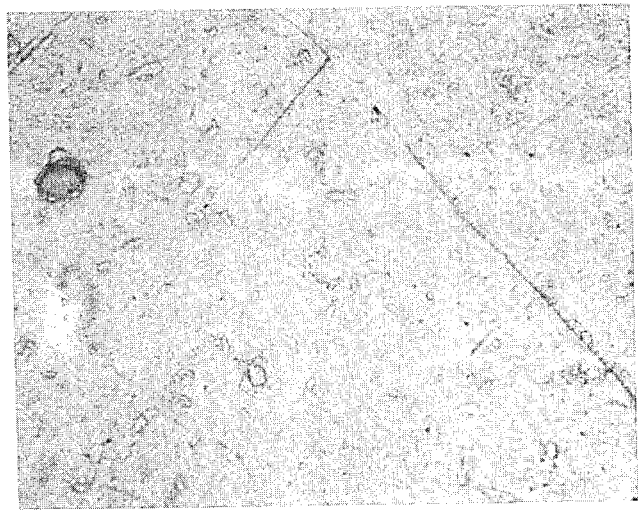
FIG. 4 is a photomicrograph of the surface of AM-350 stainless steel coated with $W+W_3C$.

The graphite and stainless steel specimens were coated with a bright, smooth, adherent, coherent, and uniform coating. The coating thickness on stainless steel specimens was ~22 micrometer. The coating on both graphite and stainless steel specimens was of columnar grains as shown in FIG. 3. The dark areas in the etched cross-section of the coating showed areas rich in W$_3$C, indicating non-uniform distribution of W and W$_3$C in the coating. The coating had a smooth surface finish as shown in FIG. 4. The average surface finish of the uncoated AM-350 stainless steel was 16 micro-inch, whereas, the average surface finish of the coated specimen was 7 micro-inch. This indicated that the coating improved the surface finish of the specimen. The composition of the coating was determined by X-ray diffraction. It consisted of a mixture of W and W$_3$C phases (see Table 2).

Example 3B

Figure 5:
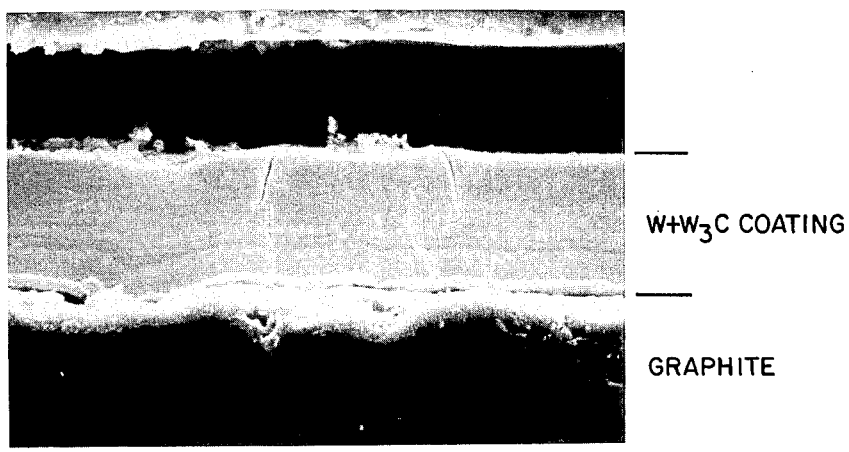
FIG. 5 is an etched cross-sectional photomicrograph of $W+W_3C$ coating on SiC-6 graphite.

The CVD run described in Example 3A was repeated with the exceptions of using 30 minutes reaction time instead of 40 minutes and 442° C. reaction temperature instead of 440° C. Once again graphite and stainless steel specimens were coated with a bright, smooth, adherent, coherent, and uniform coating. The coating thickness on stainless steel and graphite specimens was 15 and 13 micrometers, respectively. The coating on graphite and stainless steel specimens was free of columnar grains as shown in FIG. 5. The etched cross-section of the coating showed some dark areas enriched with W$_3$C, indicating that the distribution of W and W$_3$C in this coating was considerably better than obtained in Example 3A. The coating was found to contain a mixture of W and W$_3$C phases by X-ray diffraction (Table 2).

Example 3C

The CVD run described in Example 3A was repeated once again with the exceptions of using 35 minutes reaction time and 447° C. reaction temperature. All the specimens were coated with a bright, smooth, adherent, coherent and uniform coating. The coating thickness on graphite specimens was 16 micrometers. The coating was, once again, free of columnar grains. X-ray diffraction analysis revealed the presence of W and W$_3$C phases in the coating. The crystallite size of W and W$_3$C phases determined by X-ray diffraction technique was 102 and 92 Å, respectively, indicating the fine-grain structure of W+W$_3$C coating.

Example 3D to 3F

Three different CVD runs were carried out using several AM-350 stainless steel and IN-718 specimens. All the specimens were plated with 3–5 μm thick nickel using electrolytic technique. The specimens were heated to 443° C. and a gaseous mixture of 300 cc/min WF$_6$ and 3,000 cc/min of hydrogen and passed into the furnace over the specimens. Additionally, 300 cc/min of inert argon were passed over the specimens. The flow rate of DME was varied from 30 to 50 cc/min in these runs to change the WF$_6$/DME ratio from 10.0 to 6.0. The W/C atomic ratio varied from 5 to 3 in these runs. A total pressure of 40 Torr. was maintained to vary DME partial pressure from 0.33 to 0.55 Torr. (see Table 1). A constant deposition time of 30 minutes and a constant H$_2$/WF$_6$ ratio of 10.0 were used in these runs.

All the specimens used in these runs were coated with a bright, smooth, adherent, coherent, and uniform coating. The coating thickness on stainless steel specimens varied between 10 and 12 μm. The coating obtained in all the three runs was free of columnar grains. It had a smooth surface finish. The hardness of the coating varied between 2361 and 2470 Vickers. X-ray diffraction analysis indicated that coating consisted of a mixture of W and W$_3$C phases (see Table 2). The crystallite size of W phase was approximately 140 Å and it was unchanged with increasing flow rate of DME or decreasing WF$_6$/DME ratio or decreasing W/C atomic ratio or increasing DME partial pressure. However, the crystallite size of W$_3$C unexpectedly increased from 92 to 119 Å by increasing DME partial pressure from 0.33 to 0.55 or decreasing WF$_6$/DME ratio from 10 to 6 or decreasing W/C atomic ratio from 5 to 3.

Comparing Examples 3B and 3E, it can be seen that the addition of inert argon reduces DME partial pressure without changing coating composition. This observation indicates that the ratio of WF$_6$/DME or W/C atomic ratio is very critical for controlling coating composition.

Example 3G

To determine the effect of coating temperature, another CVD run was conducted using reaction conditions and specimens identical to those used in Example 3F. A lower temperature (431° C.) was used for coating. All the specimens were coated with smooth, bright, adherent, coherent and uniform coating. Coating thickness on AM-350 specimens was 8 μm. It had non-columnar grains and consisted of a mixture of W and $W_3C$ phases. The crystallite size of W and $W_3C$ phases was found to be similar to that observed in Example 3F (see Table 2).

This Example shows that $W+W_3C$ coating can be deposited at lower temperature.

Example 3H

In this Example, a SIC-6 graphite specimen was coated in a CVD run. The specimen was heated to a much lower temperature 371° C. and a gaseous mixture of 350 cc/min of $WF_6$, 3,500 cc/min of hydrogen and 65 cc/min of DME was passed into the furnace over the specimen. A total pressure of 40 Torr. was used to provide a DME partial pressure of 0.66 Torr. The ratio of $WF_6$/DME and $H_2/WF_6$ used in this Example were 5.38 and 10.0, respectively. Additionally, the W/C atomic ratio used in this Example was 2.69.

The graphite specimen was coated with a bright, smooth, adherent, coherent, and uniform coating. Coating thickness was approximately 6 $\mu$m. It was free of columnar grains and consisted of a mixture of W and $W_3C$ phases.

This Example clearly shows that a mixture of W and $W_3C$ coating can be deposited at extremely low temperature ($\sim$370° C.). Additionally, it shows that high DME partial pressure or low $WF_6$/DME ratio or low W/C atomic ratio can be used at low temperature to yield $W+W_3C$ coating.

Example 3I

In this Example, several specimens of AM-350 stainless steel and graphite were coated in a run. The stainless steel specimens were nickel plated prior to coating using electrolytic technique. The specimens were heated to a temperature of about 445° C. and a gaseous mixture of 30 cc/min $WF_6$, 3,300 cc/min of hydrogen and 60 cc/min of DME was passed into the furnace over the specimens. A total pressure of 40 Torr. was maintained in the run to give 0.66 Torr. partial pressure of DME. A $WF_6$/DME ratio of 5.0, a W/C atomic ratio of 2.5 and a $H_2/WF_6$ ratio of 11.0 were used during the run. The deposition was conducted for 40 minutes (see Table 1).

All the specimens were coated with a bright, smooth, adherent, coherent, and uniform coating. The coating thickness on AM-350 stainless steel specimens were $\sim$14 $\mu$m. The coating was free of columnar grains and consisted of a mixture of W and $W_3C$ phases.

This Example clearly shows that a mixture of W and $W_3C$ coating can be deposited using high $H_2/WF_6$ ratio ($\sim$11.0). Additionally, it shows that high DME partial pressure or low $WF_6$/DME ratio or low W/C atomic ratio can be used to yield $W+W_3C$ coating.

EXAMPLES FOR TUNGSTEN CARBON ALLOY ($W+W_2C+W_3C$) COATING

Example 4A

In this Example, several specimens of AM-350 and SS-422 stainless steel and IN-718 were coated simultaneously in a run. All the specimens were nickel plated prior to coating using electrolytic technique. The specimens were heated to a temperature of about 445° C. and a gaseous mixture of 300 cc/min $WF_6$, 3,000 cc/min. of hydrogen and 55 cc/min. of DME was passed into the furnace over the specimens. A total pressure of 40 Torr. was maintained in the run to give 0.66 Torr. partial pressure of DME. A $WF_6$/DME ratio of 5.45, a W/C atomic ratio of 2.72 and a $H_2/WF_6$ ratio of 10.0 were also maintained during the run. The deposition was conducted for 20 minutes (see Table 1).

Figure 6:
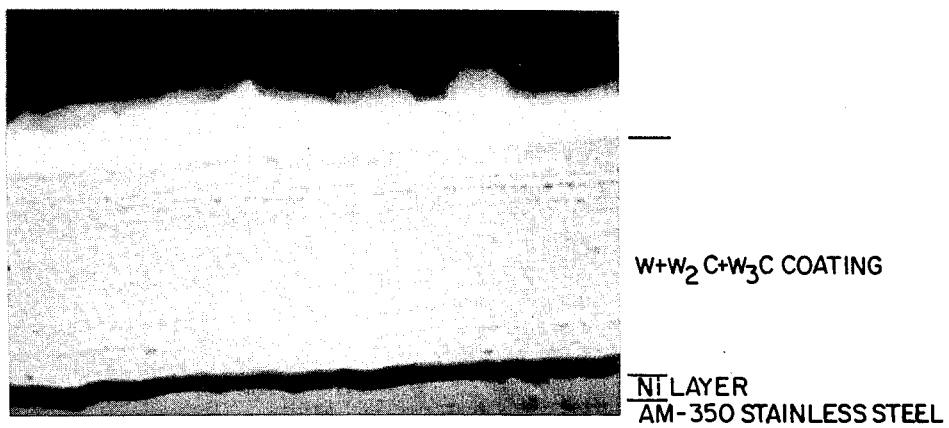
FIG. 6 is an etched cross-sectional photomicrograph of $W+W_2C+W_3C$ coating on AM-350 stainless steel.
Figure 7:
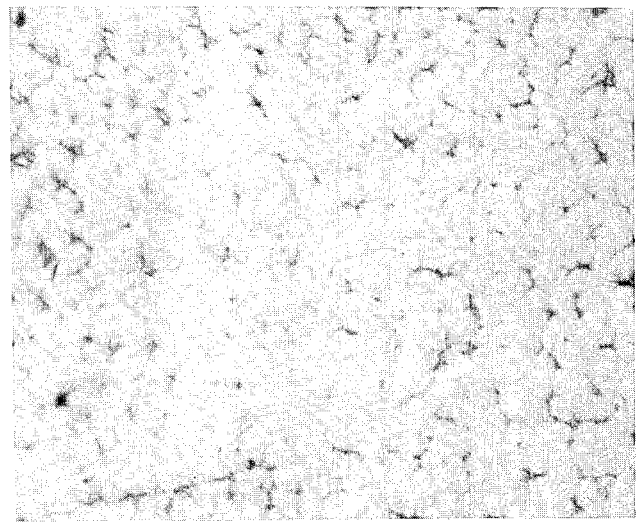
FIG. 7 is a photomicrograph of the surface of AM-350 stainless steel coated with $W+W_2C+W_3C$.

All the specimens were coated with a bright, smooth, adherent, coherent, and uniform coating. The coating thickness on AM-350 stainless steel specimens was $\sim$8 $\mu$m. The coating was free of columnar grains and consisted of coarse layered structure (see FIG. 6). The etched cross-section of the coating showed uniform distribution of W, $W_2C$ and $W_3C$. The distribution of W, $W_2C$ and $W_3C$ was considerably better than the distribution of W and $W_3C$ in the coatings described in Examples 3A and 3B. Furthermore, the coating had a smooth surface finish as shown in FIG. 7. The average surface finish of uncoated specimen was 16 micro-inch; whereas, the average surface finish of coated specimen was 5 micro-inch. This, therefore, indicated that the coating significantly improved the surface finish. The composition of the coating determined by X-ray diffraction revealed presence of a mixture of three phases, namely W, $W_2C$ and $W_3C$ (see Table 2).

Comparing this Example to Examples 3A to 3H, it can be seen that the use of lower $WF_6$/DME ratio or lower W/C atomic ratio or higher DME partial pressure unexpectedly results in the formation of $W+W_2C+W_3C$ coating rather than $W+W_3C$ coating. Besides difference in coating composition, the microstructure of $W+W_2C+W_3C$ coating shown in FIG. 6 is dramatically different from the $W+W_3C$ coating shown in FIG. 3. The hardness of $W+W_2C+W_3C$ coating, however, is very similar to that of $W+W_3C$ coating.

Comparing this Example to Example 3H, it can be seen that reaction temperature is very important for controlling coating composition and microstructure. Example 3H resulted in the formation of $W+W_3C$ coating despite the use of lower $WF_6$/DME ratio or lower W/C atomic ratio or higher DME partial pressure.

Example 4B

The CVD run described in Example 4A was repeated using a number of AM-350 specimens. The reaction conditions used were the same with the exceptions of using 443° C. reaction temperature, 15 minutes reaction time and 300 cc/min of argon gas. The addition of argon gas did not alter the $WF_6$/DME, W/C atomic and $H_2/WF_6$ ratios, but reduced the DME partial pressure to 0.60 Torr. All the specimens were coated with a bright, smooth, adherent, coherent, and uniform coating. The coating thickness was 5 $\mu$m. The coating was free of columnar grains and had coarse layered structure. X-ray diffraction analysis of the coating indicated the presence of W, $W_3C$ and trace amounts of $W_2C$ phases.

This Example, demonstrates the importance of $WF_6$/DME ratio or W/C atomic ratio and temperature for controlling coating composition. A small drop in temperature in this Example compared to Example 4A causes a dramatic reduction in the amount of $W_2C$ in the coating. A small decrease in DME partial pressure while maintaining $WF_6$/DME ratio or W/C atomic ratio, however, does not cause a change in overall coating composition.

Example 4C

In this Example several AM-350, SS-422 and IN-718 specimens similar to those used in Example 4A were coated using the reaction conditions very similar to those used in Example 4B with the exceptions of using slightly higher DME flow rate and reaction time. The DME flow rate used was 60 cc/min causing $WF_6$/DME ratio to decrease to 5.0, W/C atomic ratio to decrease to 2.50 and DME partial pressure increase to 0.66 Torr. A $H_2$/$WF_6$ ratio used during coating was 10.0. All the specimens were coated with a bright, smooth, adherent, coherent, and uniform coating. The coating was free of columnar grains and had coarse layered structure. The coating thickness was 12 μm. It had a hardness of over 2,000 Vickers. X-ray diffraction analysis of the coating revealed the presence of W, $W_3C$ and a trace amount of $W_2C$. This Example, therefore, indicated that a decrease in $WF_6$/DME ratio from 5.45 to 5.0 or W/C atomic ratio from 2.72 to 2.50 and increase in DME partial pressure from 0.60 to 0.66 were not effective in changing coating composition. The crystallite size of W and $W_3C$ determined by X-ray diffraction was 80 and 52 Å, respectively, indicating fine-grained microstructure of the coating. The crystallite sizes of W+$W_2C$+$W_3C$ coating was somewhat smaller than that of W+$W_3C$ coating (compare Examples 3H and Example 4C).

Comparing this Example to Example 3I, it can be seen that $H_2$/$WF_6$ ratio is very important for controlling coating composition and microstructure. Example 3I resulted in the formation of W+$W_3C$ coating despite the use of similar $WF_6$/DME ratio, W/C atomic ratio and DME partial pressure.

Example 4D

The CVD run described in Example 4C was repeated using similar specimens and reaction conditions with the exception of using lower reaction time (20 min.) and slightly higher DME flow rate (62 cc/min.). Use of 62 cc/min. DME flow rate reduced $WF_6$/DME ratio to 4.84, reduced W/C atomic ratio to 2.41 and increased DME partial pressure to 0.68 Torr. It, however, did not result in any change in $H_2$/$WF_6$ ratio. Once again, all the specimens were coated with a bright, smooth, adherent, coherent and uniform coating. The coating thickness was 5 μm. It was free of columnar grains and had coarse layered structure. X-ray diffraction analysis revealed presence of W, $W_2C$ and $W_3C$ phases in the coating. The crystallite size of W and $W_2C$ phases in the coating are summarized in Table 2.

This Example shows that at certain DME partial pressure or $WF_6$/DME ratio or W/C atomic ratio, a small increase in DME partial pressure or decrease in $WF_6$/DME ratio or W/C atomic ratio causes a major change in coating composition. A small increase in DME partial pressure causes the amount of $W_2C$ in the coating to increase from trace amount to minor component.

Example 4E

The CVD run described in Example 4A was repeated using same type of specimens and similar reaction conditions with the exception of using higher reaction temperature (451° C. as opposed to 445° C.). All the specimens were coated with a bright, smooth, adherent, coherent and uniform coating. The coating thickness on AM-350 specimens was 13 μm. It was free of columnar grains and had coarse layered microstructure. The coating consisted of W, $W_2C$ and $W_3C$ phases, indicating no major change in coating composition by increasing reaction temperature from 445° to 451° C.

Example 4F

Several AM-350 stainless steel and SIC-6 graphite specimens were placed in the reactor described earlier. AM-350 stainless steel specimens were electroplated with 4-5 μm thick nickel prior to coating operation. The reactor was heated to 462° C. and a flow of 300 cc/min of $WF_6$, 3,000 cc/min of hydrogen and 60 cc/min of DME was established through the reactor for 35 minutes. A total pressure of 40 Torr. was maintained during the reaction. These flow ratio and pressure resulted in a $WF_6$/DME ratio of 5.0, a W/C atomic ratio of 2.50, a $H_2$/$WF_6$ ratio of 10.0, and DME partial pressure of 0.71 Torr. All the specimens were coated with a bright, shiny, smooth, adherent and coherent coating. The coating thickness on AM-350 specimens was 15 μm. It was free of columnar grains and consisted of fine layered structure. X-ray diffraction analysis revealed that the coating consisted of a mixture of W, $W_2C$, and $W_3C$ phases, as shown in Table 2. The crystallite size of the coating varied from 73 to 164 Å, as shown in Table 2.

This Example, therefore, demonstrates that a mixture of W, $W_2C$, and $W_3C$ coating can be formed by using $WF_6$/DMF ratio of 5.0 or W/C atomic ratio of 2.50, $H_2$/$WF_6$ ratio of 10.0, DME partial pressure of 0.71 Torr., and a temperature of 462° C. It also demonstrates that coating microstructure changes to fine layered structure by increasing the reaction temperature.

Example 4G

An experiment similar to that described in Example 4F was carried out again. This time only SIC-6 graphite specimens were used. The flow rate of DME was increased from 60 to 70 cc/min to provide a $WF_6$/DME ratio of 4.29 or W/C atomic ratio of 2.14 and a DME partial pressure of 0.83 Torr. A $H_2$/$WF_6$ ratio of 10.0 was maintained during the run. A reaction time of 40 min. was used. Other conditions were kept the same. Once again, all the specimens were coated with a bright, smooth, adherent and coherent coating of 13 μm thickness. The coating was free of columnar grains, and consisted of fine layered structure. X-ray diffraction analysis of the coating revealed presence of W, $W_2C$ and trace amount of $W_3C$ phases (see Table 2). The crystallite size of the coating varied from 120 to 150 Å, as shown in Table 2.

This Example clearly shows that a coating consisting of a mixture of W, $W_2C$ and $W_3C$ can be formed by using 462° C. temperature, 4.29 $WF_6$/DME ratio or W/C atomic ratio of 2.14, 10.0 $H_2$/WF6 ratio and 0.83 Torr. DME partial pressure. It also indicates that increasing DME partial pressure or decreasing $WF_6$/DME ratio or W/C atomic ratio is responsible for reducing the amount of $W_3C$ in the coating.

Example 4H

A CVD experiment using SIC-6 graphite specimens was carried out in a reactor similar to that described earlier. This time flow rate of 300 cc/min. of $WF_6$, 3,000 cc/min. of hydrogen and a very low flow 40 cc/min. of DME was used. A reaction time of 40 min. and a total pressure of 40 Torr. were used for the coating experiment. These flow rates and pressure provided $WF_6$/DME ratio of 7.5 W/C atomic ratio of 3.75, $H_2$/$WF_6$ ratio of 10.0 and DME partial pressure of 0.48 Torr. A reaction temperature of 467° C. was used. All the specimens were coated with a bright, smooth, adherent and coherent coating of ~22 μm thickness. The coating was free of columnar grains and consisted of coarse layered structure. X-ray diffraction analysis revealed that the coating consisted of a mixture of W, $W_3C$ and trace amount of $W_2C$ phases.

Comparing Examples 3A, 3B and 3C to Example 4H, it can be seen that increasing reaction temperature from ~447° C. to 467° C. results in an unexpected change in coating composition. This Example, therefore, shows the importance of reaction temperature in controlling coating composition.

Example 4I

CVD experiment described in Example 4H was repeated with 35 cc/min. of DME rather than 40 cc/min. Other conditions were kept constant. The reduction in DME flow rate caused $WF_6$/DME ratio to increase to 8.57, W/C atomic ratio increase to 4.23 and DME partial pressure to drop to 0.42 Torr. A $H_2$/$WF_6$ ratio of 10.0, however, was maintained during the run. Once again, all the specimens were coated with a bright, smooth, adherent and coherent coating of ~21 μm thickness. The coating was free of columnar grains and consisted of coarse layered structure. X-ray diffraction analysis revealed that the coating consisted of a mixture of W, $W_3C$ and trace amount of $W_2C$ phases. This Example showed that a mixture of W, $W_2C$ and $W_3C$ can be formed at 467° C., 8.57 $WF_6$/DME ratio, W/C atomic ratio of 4.23, 10.0 $H_2$/$WF_6$ ratio and 0.42 Torr. DME partial pressure.

Example 4J

CVD experiment described in Example 4I was repeated with using 50 Torr. total pressure and 474° C. reaction temperature. The change in total pressure caused DME partial pressure to increase from 0.42 to 0.52, but it did not affect the $WF_6$/DME, W/C atomic and $H_2$/$WF_6$ ratios. All the specimens were coated with a bright, smooth, adherent, and coherent coating of ~22 μm thickness. The coating was free of columnar grains, and consisted of coarse layered structure. X-ray diffraction analysis revealed that the coating consisted of a mixture of W, $W_2C$ and $W_3C$ phases.a This Example shows that increasing both temperature and DME partial pressure cause the amount of $W_2C$ in the coating to increase (compare Examples 4I and 4J). This finding is unexpected.

Example 4K

CVD experiment described in Example 4J was repeated with using 100 Torr. total pressure, 24 cc/min. DME, 400 cc/min. $WF_6$ and 4,000 cc/min. hydrogen flow rates, 477° C. reaction temperature, and 15 min. reaction time. These flow rates and pressure caused $WF_6$/DME ratio, W/C atomic ratio and DME partial pressure to increase to 16.7, 8.35 and 0.54 Torr., respectively. A constant $H_2$/$WF_6$ ratio of 10.0, however, was used during the run. All the specimens were coated with a bright, smooth, adherent, and coherent coating of 20 μm thickness. The coating was free of columnar grains, and consisted of coarse layered structure. X-ray diffraction analysis revealed that the coating consisted of a mixture of W, $W_3C$ and a trace amount of $W_2C$ phases.

This Example, therefore, indicates that a mixture of W, $W_2C$ and $W_3C$ can be formed by using 477° C. temperature, 16.7 $WF_6$/DME ratio, 8.35 W/C atomic ratio, 10.0 $H_2$/$WF_6$ ratio and 0.54 Torr. DME partial pressure.

Example 4L

In this Example, several AM-350 and IN-718 specimens similar to those used in Example 4A were coated. The specimens were heated to a temperature of about 445° C. and a gaseous mixture of 220 cc/min. $WF_6$, 2,400 cc/min. of hydrogen, 3,000 cc/min. of argon and 60 cc/min. of DME was passed into the furnace over the specimens. A total pressure of 40 Torr. was maintained in the run to give 0.42 Torr. partial pressure of DME. A $WF_6$/DME ratio of 3.33, W/C atomic ratio of 1.67, and a $H_2$/$WF_6$ ratio of 12.0 were also maintained during the run. The deposition was conducted for 90 minutes (see Table 1).

All the specimens were coated with a bright, smooth, adherent, coherent, and uniform coating. The coating thickness was AM-350 stainless steel specimens was ~13μ. The coating was fine of columnar grains and consisted of course layered structure. X-ray diffraction analysis of the coating indicated the presence of W, $W_2C$ and $W_3C$ phases (see Table 2).

This example, therefore, indicates that a mixture of W, $W_2C$ and $W_3C$ can be formed using 445° C. temperature, 3.33 $WF_6$/DME ratio, 1.67 W/C atomic ratio, 12.0 $H_2$/$WF_6$ ratio, and 0.42 Torr. DME partial pressure. It also indicates that a low $WF_6$/DME ratio or W/C atomic ratio can be used to produce W+$W_2C$ coating provided a $H_2$/$WF_6$ ratio of 12.0 is used. This example also indicates the importance of $H_2$/$WF_6$ ratio for controlling coating composition.

Examples 4M and 4N

In these examples, several AM-350 and IN-718 specimens similar to those used in Example 4A were coated. The specimens were heated to a temperature of about 445° C. and a gaseous mixture of 200 cc/min $WF_6$, 2,400 cc/min of hydrogen, 6,000 cc/min argon and 60 cc/min of DME was passed into the furnace over the specimens in both runs. A total pressure of 40 Torr. was maintained in the run to give 0.28 Torr. partial pressure of DME. A $WF_6$/DME ratio of 3.33, W/C atomic ratio of 1.67 and a $H_2$/$WF_6$ ratio of 12.0 were also maintained during the two runs. The deposition was conducted for 90 and 80 minutes, respectively (see Table 1)

All the specimens were coated with a right, smooth, adherent, coherent, and uniform coating. The coating thickness on AM-350 stainless steel was ~12μ. the coating was free of columnar grains and consisted of coarse layered structure. X-ray diffraction analysis of the coating indicated the presence of W, $W_2C$ and $W_3C$ phases (see Table 2)

These examples show that a mixture of W, $W_2C$ and $W_3C$ can be formed using extremely low DME partial pressure provided $WF_6$/DME ratio or W/C atomic ratio is maintained below certain level.

Comparing examples L and M it is clearly evident that the addition of diluent argon simply lowers the partial pressure of DME. It does not effect $WF_6$/DME, W/C atomic and $H_2$/$WF_6$ ratios. Therefore, it does not cause any changes in coating composition.

EXAMPLES FOR TUNGSTEN-CARBON ALLOY (W+W₂C) COATING

Example 5A

Five 0.095 inch×1 inch×2 inch SIC-6 graphite specimens were placed in an inductively heated graphite furnace inside a gas-tight quartz envelope. The specimens were heated to a temperature of 477° C. and a gaseous mixture of 400 cc/min of WF$_6$, 4000 cc/min of hydrogen, and 65 cc/min of DME was passed into the furnace over the specimens. The total pressure within the system was maintained at 100 Torr. to provide a DME partial pressure of 1.46 Torr. The ratios of WF$_6$/DME, W/C atomic and H$_2$/WF$_6$ used were 6.15, 3.08 and 10.0, respectively. The deposition was conducted for 15 minutes; thereafter, the flow of the reactive gases was stopped and the specimens were cooled.

The specimens were found to be coated with a bright, smooth, adherent, coherent, and uniform coating of 25 micrometers thick on each side (see Table 1). The coating was free of columnar grains. It consisted of extremely fine grains. Additionally, it had a well defined layered microstructure with layers 1-2 μm thick. The coating had a hardness of 2512 Vickers. The composition of the coating was determined by X-ray diffraction. It was comprised of a mixture of W and W$_2$C phases, as shown in Table 2.

Comparing this Example to Example 4K, it can be seen that increasing DME partial pressure and decreasing WF$_6$/DME ratio or W/C atomic ratio simultaneously causes a unexpected change in coating composition. Additionally, it results in higher coating hardness.

Example 5B

Several AM-350 and SiC-6 graphite specimens were coated in a reactor similar to that described in Example 5A. A reaction temperature of 463° C., total pressure of 40 Torr. and flow rate of 300 cc/min WF$_6$, 3,000 cc/min hydrogen and 85 cc/min of DME were used for the reaction. Reaction time used was 50 min. These conditions provided WF$_6$/DME ratio, W/C atomic ratio and DME partial pressure of 3.53 1.77 and 1.00 Torr., respectively. These conditions also provided H$_2$/WF$_6$ ratio of 10.0. All the specimens were coated with a bright, smooth, adherent, coherent, and uniform coating of 25 μm thick (AM-350) on each side (see Table 1). The coating was free of columnar grains. Additionally, it had a well defined fine layered microstructure with layers less than 1 μm apart. The coating had a hardness of 2758 Vickers. The coating was found to contain a mixture of W and W$_2$C phases. The crystallite size of the coating was less than 50 Å.

This Example, therefore, shows that a mixture of W and W$_2$C can be formed by using 463° C. temperature, 3.53 WF$_6$/DME ratio, 1.77 W/C atomic ratio, 10.0 H$_2$/WF$_6$ ratio and 1.00 Torr. DME partial pressure. Additionally, it indicates that the crystallite size of the coating is considerably smaller than that noted in Examples 3 and 4. Furthermore, it indicates that the hardness of the coating is considerably higher than that noted in Examples 3 and 4.

Example 5C

Figure 8A:
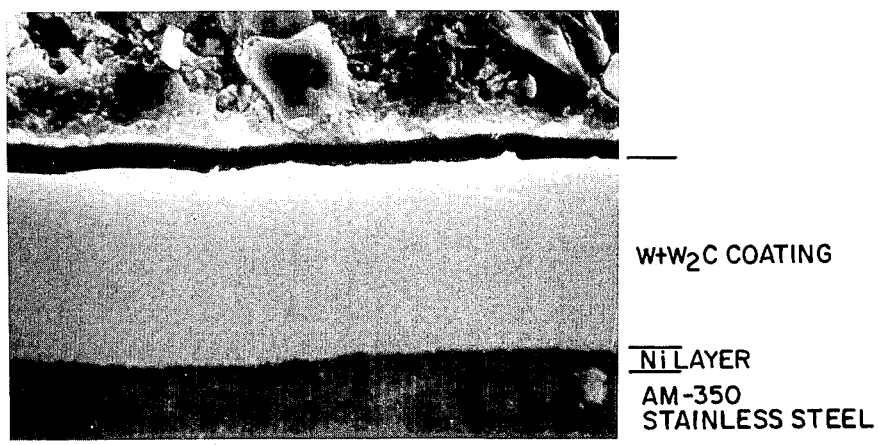
FIG. 8A is an unetched cross-sectional photomicrograph of $W+W_2C$ coating on AM-350 stainless steel.
Figure 8B:
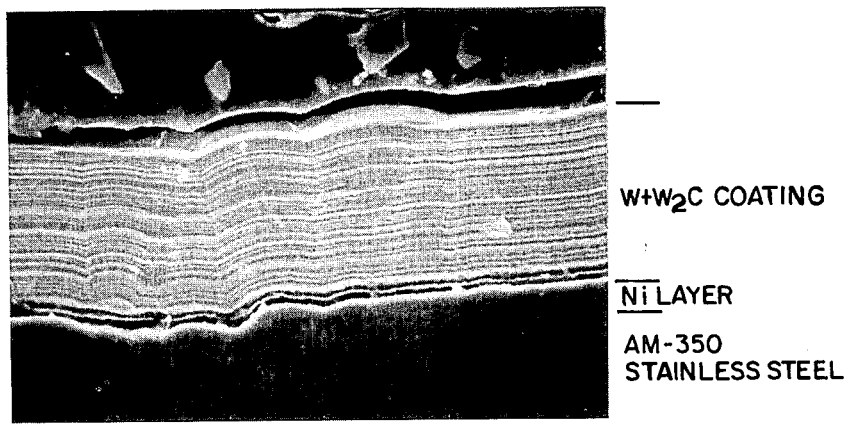
FIG. 8B is an etched cross-sectional photomicrograph of $W+W_2C$ coating on AM-350 stainless steel.
Figure 9:
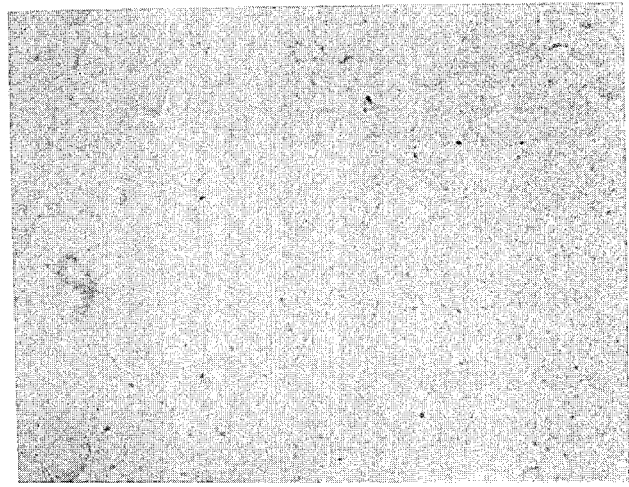
FIG. 9 is a photomicrograph of the surface of AM-350 stainless steel coated with $W+W_2C$.

CVD experiment described in Example 5B was repeated with the exception of using 443° C. temperature and 35 minutes reaction time. All the specimens were, once again, coated with bright, smooth, adherent, coherent, and uniform coating of 20 μm thick on each side (see Table 1). The coating was free of columnar grains. It consisted of a well defined fine layered structure, as shown in FIG. 8. The etched cross-section of the coating showed very uniform distribution of W and W$_2$C. The coating had a smooth surface finish as shown in FIG. 9. The average surface finish of uncoated AM-350 stainless steel specimen was 54 micro-inch; whereas, the coated specimen had an average surface finish of 33 micro-inch. This, therefore, indicated that W+W$_2$C coating considerably improved the surface finish of the specimen. X-ray diffraction analysis of the coating revealed the presence of W and W$_2$C phases in the coating. The crystallite size was less than 50 Å (see Table 2).

This Example shows that a mixture of W and W$_2$C can be formed at lower temperature (443° C.) as well.

Examples 5D to 5L

A number of CVD experiments were conducted to coat AM-350, AM-355 and SS-422 stainless steel, SiC-6 graphite and IN-718 specimens simultaneously in a run. Reaction temperature was varied in a very narrow range; it was varied from 440° to 445° C. (see Table 1). Total pressure was kept constant at 40 Torr. in all these runs. The flow rates of WF$_6$ and hydrogen were also kept the same in these runs. Flow rates of DME was varied from 70 to 100 cc/min. Additionally, diluent argon gas was used in some experiments and not used in others. The WF$_6$/DME ratio was varied from 3.00 to 4.29, the W/C atomic ratio varied from 1.5 to 2.65, and the partial pressure of DME was varied from 0.76 to 1.08 Torr. However, the ratio of H$_2$/WF$_6$ was maintained at 10.0 in all the experiments. Reaction time was also varied in these experiments, as shown in Table 1.

All these experiments yielded bright, smooth, adherent, coherent, and uniform coating of varying thicknesses (see Table 1). The coating obtained in all these experiments was free of columnar grains. It consisted of well defined fine layered structure. The coating obtained in these experiments was extremely hard, as shown in Table 1. Additionally, it consisted of mixture of W and W$_2$C phases (see Table 2). The crystallite size of the coating was less than 50 Å (see Table 2).

These Examples show wide variations in process conditions that can be used to produce W+W$_2$C coating.

Examples 5M and 5N

Two CVD experiments were conducted to coat AM-350, AM-355 and SS-422 stainless steel, SiC-6 graphite and IN-718 specimens simultaneously in a run. Reaction conditions used in these experiments were the same with the exception of using two different flow rate of DME (see Table 1). The partial pressure of DME used in these runs was 0.76 and 0.97 Torr., WF$_6$/DME ratio used was 3.33 and 4.29, and W/C atomic ratio used was 1.67 and 2.15. The ratio of H$_2$/WF$_6$ used in these experiments was 10.0. All the specimens were coated with bright, smooth, adherent, coherent, and uniform coating (see Table 1 for coating thickness). The coating was free of columnar grains. It consisted of fine layered microstructure. Coating was extremely hard, as shown in Table 1. It consisted of a mixture of W and W$_2$C phases (see Table 2). The crystallite size of the coating with higher DME partial pressure or lower WF$_6$/DME ratio or lower W/C atomic ratio was similar to the one obtained with lower DME partial pressure or higher $WF_6$/DME ratio or higher W/C atomic ratio.

Example 5O and 5P

These Examples were repeats of Examples 5M and 5N with the exception of using 454° C. reaction temperature. Once again, all the specimens were coated with bright, smooth, adherent, coherent, and uniform coating (see Table 1). The coating was free of columnar grains. It consisted of fine layered microstructure. The coating was extremely hard, as shown in Table 1. It comprised of W and $W_2C$ phases with crystallite size less than 50 Å.

Examples 5Q to 5U

A number of CVD experiments were conducted to coat AM-350, AM-355 and SS-422 stainless steel and IN-718 specimens simultaneously in a run. Reaction temperature in these runs was varied from 421° to 445° C. Total pressure, flow rates of $WF_6$, hydrogen and DME were kept constant in these runs (see Table 1). A diluent argon gas was used in all these runs, and its flow rate was varied from 1,500 to 1,800 cc/min. The flow rate of diluent was considerably higher than used before. The partial pressure of DME was varied from 0.69 to 0.74 Torr.; however, the $WF_6$/DME, W/C atomic and $H_2$/$WF_6$ ratios were kept constant in these runs. Reaction time was also varied in these experiments.

All the specimens used in these runs were coated with bright, smooth, adherent, coherent, and uniform coating (see Table 1 for coating thickness). The coating was free of columnar grains. It consisted of fine layered microstructure. The hardness of coating was around 2,400 Vickers, which was considerably lower than that observed at very low argon or no argon flow rates. The coating consisted of W and $W_2C$ phases, and the crystallite size of the coating was less than 50 Å (see Table 2).

These Examples clearly show that a diluent can be used during coating reaction without affecting coating composition and crystallite size. However, the diluent is found to affect coating hardness. The change in coating hardness probably is related to change in coating rate.

Comparing Examples 5T and U to Examples 4L, M and N it can be seen that the ratio of $H_2$/$WF_6$ is very important for controlling the coating composition. It has already been shown in Examples 5P to 5U that simply increasing diluent flow rate does not cause any changes in overall coating composition provided $WF_6$/DME, W/C atomic and $H_2$/$WF_6$ ratios are kept constant. Examples 4L and 4N, on the other hand, show that increasing $H_2$/$WF_6$ ratio from 10.0 as used in Examples 5P to 5U to 12.0 changes the coating composition from $W+W_2C$ to $W+W_2C+W_3C$. These examples, therefore, demonstrate the importance of $H_2$/$WF_6$ ratio.

Example 5V

Several AM-350 and IN-718 specimens were coated in a reactor similar to that described in Example 5A. A reaction temperature of 445° C., total pressure of 40 Torr. and flow rate of 200 cc/min. $WF_6$, 2,000 cc/min. hydrogen, 3,500 cc/min. argon and 60 cc/min. of DME were used for the reaction. Reaction time used was 90 min. These conditions provided $WF_6$/DME ratio of 3.33, W/C atomic ratio of 1.67, $H_2$/$WF_6$ ratio of 10.0 and DME partial pressure of 0.42 Torr. All the specimens were coated with a bright, smooth, adherent, coherent, and uniform coating of ~9 μm thick (AM-350) on each side (see Table 1). The coating was fine of columnar grains. Additionally, it had a well defined five layered microstructure with layers less than 1 μm apart. The coating had a hardness of 2035 Vickers. The coating was found to contain a mixture of W and $W_2C$ phases (see Table 3). The crystallite size of the coating was less than 50 Å.

This example, therefore, shows that low flow ratios of $WF_6$, hydrogen and DME can be used to produce W and $W_2C$ coatings provided $WF_6$/DME, W/C atomic and $H_2$/$WF_6$ ratios are maintained.

Examples 5W and 5X

Several AM-350 and IN-718 specimens were once again coated in a reactor using two different runs using 445° C. temperature, 40 Torr. total pressure and flow rate of 100 cc/min. $WF_6$, 1,000 cc/min. hydrogen and 30 cc/min. DME. Additionally, 5,000 cc/min. of argon was used in Example W; whereas, only 4,000 cc/min. of argon was used in Example X. Reaction time used in these runs was 150 and 180 minutes, respectively. These conditions provided $WF_6$/DME, W/C atomic and $H_2$/$WF_6$ ratios of 3.33, 1.67 and 10.0, respectively. All the specimens were coated with a bright, smooth, adherent, coherent and uniform coating of ~9 μm thick on each side (see Table 1). The coating was free of columnar grains and consisted of a mixture of W and $W_2C$ phases.

These examples, once again, show that low flow rates of $WF_6$, hydrogen and DME can be used to produce W and $W_2C$ coatings provided $WF_6$/DME, W/C atomic and $H_2$/$WF_6$ ratios are maintained.

Example 5Y

In this example several AM-350 and IN-718 specimens were coated in a run. A reaction temperature of 445° C., total pressure of 40 Torr. and flow rate of 200 cc/min. $WF_6$, 1,600 cc/min. of hydrogen, 4,000 cc/min. of argon and 60 cc/min. of DME were used for the reaction. Reaction time used was 100 min. These conditions provided $WF_6$/DME ratio, W/C atomic ratio and DME partial pressure of 3.33, 1.67 and 0.41 Torr., respectively. The ratio of $H_2$/$WF_6$ used was 8.0, which was greater than the stoichiometric ratio required for complete conversion of $WF_6$ to HF gas. All the specimens were coated with a bright, smooth, adherent, coherent, and uniform coating of ~9 μm thick on each side. The coating was free of columner grains and consisted of a mixture of W and $W_2C$ phases.

This example, therefore, shows that a mixture of W and $W_2C$ can be produced provided a certain ratio of $WF_6$/DME or W/C atomic ratio and more than stoichiometric amount of hydrogen required for complete conversion of $WF_6$ to HF are used.

Example 5Z

In this example, several AM-350 and IN-718 specimens were coated in a run. A reaction temperature of 445° C., total pressure of 40 Torr. and flow rate of 200 cc/min $WF_6$, 1,200 cc/min. hydrogen, 4,500 cc/min. argon and 60 cc/min. DME were used for the reaction. The reaction time used was 130 min. These conditions provided $WF_6$/DME ratio, W/C atomic ratio and DME partial pressure of 3.33, 1.67 and 0.40 Torr., respectively. The ratio of $H_2$/$WF_6$ used was 6.0, which was greater than the stoichiometric ratio required for complete conversion of $WF_6$ and HF gas. All the specimens were coated with a bright, smooth, adherent, coherent, and uniform coating of ~10 μm thick on each side. The coating was free of columner grains and consisted of a mixture of W and $W_2C$ phases.

This example, once again, shows that a mixture of W and $W_2C$ can be produced provided a certain ratio of $WF_6$/DME or W/C atomic ratio and more than stoichiometric amount of hydrogen required for complete conversion of $WF_6$ to HF are used.

Example 6

In this Example, two specimens of cemented carbide (94% tungsten carbide and 6% cobalt) were coated in a run. The specimens were not nickel plated prior to coating experiment. The specimens were heated to a temperature of about 445° C. and a gaseous mixture of 300 cc/min. $WF_6$, 3,000 cc/min. of hydrogen and 55 cc/min. of DME was passed into the furnace over the specimens. A total pressure of 40 Torr. was maintained in the run to give 0.66 Torr. partial pressure of DME. A $WF_6$/DME ratio of 5.45, W/C atomic ratio of 2.73, and $H_2$/$WF_6$ ratio of 10.0 were maintained during the run. The deposition was conducted for 20 minutes.

The specimens were coated with a bright, smooth, adherent, coherent, and uniform coating. The coating thickness was ~8 μm. The coating was free of columnar grains and consisted of layered structure. The etched cross-section of the coating showed uniform distribution of W, $W_2C$ and $W_3C$. The coating had a smooth surface finish.

This example therefore shows that the tungsten/carbon alloy coatings of the present invention can be deposited on cemented carbide. Additionally, it shows that there is no need to provide a nickel or copper interlayer to protect the cemented carbide while depositing tungsten/carbon alloys.

Example 7

In this example, two specimens of titanium alloy (Ti-6Al/4V) were coated in a run. Both the specimens were plated with 4-5 μm thick nickel using electroless nickel technique. The specimens were heated to a temperature of about 445° C. and a gaseous mixture of 300 cc/min. $WF_6$, 3,000 cc/min. of hydrogen and 55 cc/min. of DME was passed into the furnace over the specimens. A total pressure of 40 Torr. was maintained in the run to give 0.66 Torr. partial pressure of DME. A $WF_6$/DME ratio of 5.45 or W/C atomic ratio of 2.73 was also maintained during the run. A $H_2$/$WF_6$ ratio of 10.0 was also maintained during the run. The deposition was conducted for 20 minutes.

The specimens were coated with a bright, smooth, adherent, coherent, and uniform coating. The coating thickness was ~8 μm. The coating was free of columnar grains and consisted of layered structure. X-ray diffraction analysis revealed the presence of W, $W_2C$ and $W_3C$ in the coating.

This example clearly shows that titanium alloys can be coated with tungsten/carbon alloys described in the present invention. However, a protective nickel layer is required before coating titanium alloys with tungsten/carbon alloys.

Example 8

In this example, several specimens of 2219 aluminum were coated in a CVD run. All the specimens were plated with 4-5 μm thick nickel using electroless technique. The specimens were heated to a temperature of about 371° C. and a gaseous mixture of 350 cc/min. $WF_6$, 3,500 cc/min. of hydrogen and 65 cc/min. of DME was passed into the furnace over the specimens for 20 minutes. A total pressure 40 Torr. was used to provide a DME partial pressure of 0.66 Torr. The ratio of $WF_6$/DME used was 5.38. Additionally, the $H_2$/$WF_6$ and W/C atomic ratios used were 10.0 and 2.69, respectively.

All the specimens were coated with a bright, smooth, adherent, coherent and uniform coating. Coating thickness was approximately 5 μm. It was free of columnar grains and consisted of a mixture of W and $W_3C$ phases.

This example clearly shows that tungsten/carbon alloy can be deposited on aluminum. However, a protective nickel layer is required before coating aluminum with tungsten/carbon alloys.

Example 9

In this example, two specimens of alumina ($Al_2O_3$) were coated in a run. The specimens were not nickel plated prior to coating experiment. The specimens were heated to a temperature of about 443° C. and a gaseous mixture of 300 cc/min. of $WF_6$, 3,000 cc/min. of hydrogen, 70 cc/min. of DME and 300 cc/min. of argon was passed into the furnace over the specimens. A total pressure of 40 Torr. was maintained in the run to give 0.76 Torr. partial pressure of DME. A $WF_6$/DME ratio of 4.29 and W/C atomic ratio of 2.15 were also maintained during the run. Additionally, a $H_2$/$WF_6$ ratio of 10.0 was maintained during the run. The deposition was conducted for 40 minutes.

The specimens were coated with a bright, smooth, adherent, coherent and uniform coating of ~12 μm thickness. The coating was free of columnar grains and consisted of layered structure. X-ray diffraction revealed the pressure of W, $W_2C$ and $W_3C$ in the coating. The coating had a smooth surface finish.

This example shows that tungsten/carbon alloy coatings of the present invention case be deposited of ceramic substrates such as alumina. Additionally, it shows that there is no need to provide a nickel or copper interlayer to protect the ceramic substrates while depositing tungsten/carbon alloys.

Example 10

In this example, two six-inch long and ¼" diameter molybdenum rods were coated in a run. The molybdenum rods were not nickel plated prior to coating experiment. The rods were heated to a temperature of about 445° C. and a gaseous mixture of 300 cc/min. $WF_6$, 3,000 hydrogen and 40 cc/min. of DME was passed into the furnace over the specimens for 90 minutes. A total pressure of 40 Torr. was used to provide a DME partial pressure of 0.48 Torr. The ratio of $WF_6$/DME used was 7.5. Additionally, the $H_2$/$WF_6$ and W/C atomic ratio used were 10.0 and 3.75, respectively.

Both rods were coated with a bright smooth, adherent, coherent and uniform coating of ~13 μm thickness. It was free of columnar grains and consisted of a mixture of W and $W_3C$ phases.

This example shows that tungsten/carbon alloys of the present invention run be deposited on molybdenum without a protective interlayer.

Example 11

The experiment described in Example 10 was repeated with the exception of using higher (55 cc/min.) DME flow rate. This high DME flow rate provided a DME partial pressure of 0.66 Torr. The WF$_6$/DME and W/C atomic ratios used were 5.5 and 2.75, respectively. The ratio of H$_2$/WF$_6$ used was 10.0.

Both rods were, once again, coated with a bright, smooth, adherent, coherent and uniform coating of ~11 μm thickness. It was free of columnar grains and consisted of mixture of W, W$_2$C and W$_3$C phases.

This example clearly shows that tungsten/carbon alloys of the present invention can be deposited on molybdenum without a protective interlayer.

Example 12

In this example, a two step coating process was used. Several AM-350, Ti/6Al/4V and IN-718 specimens were placed in an inductively heated furnace. All the specimens were plated with 3-4 μm thick nickel using either electrolytic or electroless technique prior to CVD experiment. The specimens were heated to a temperature of about 442° C. and a gaseous mixture of 300 cc/min. WF$_6$ and 3,000 cc/min. of hydrogen was passed into the furnace over the specimens for five minutes to coat them with tungsten. After coating the specimens with tungsten for five minutes, a gaseous mixture of 300 cc/min. WF$_6$, 3,000 cc/min. of hydrogen and 40 cc/min. of DME was passed into the furnace for 55 minutes to provide tungsten/carbon alloy coating. A total pressure of 40 Torr. was maintained during the run to provide a DME partial pressure of 0.48 Torr., a WF$_6$/DME ratio of 7.5, and a W/C atomic ratio of 3.75, respectively. Additionally, a H$_2$/WF$_6$ ratio of 10.0 was used during the coating steps.

All the specimens were coated with 2-3 μm thick tungsten followed by 27-28 μm thick tungsten/carbon alloy. The coating was bright, smooth, adherent, coherent and uniform. The tungsten interlayer had a well defined columnar structure; whereas, tungsten/carbon alloy had non-columnar structure. It consisted of a mixture of W and W$_3$C phases.

This example clearly shows that the tungsten/carbon alloys can be deposited on various substrates with a tungsten interlayer.

Example 13

The erosion performance of some of the coated specimens was determined using a miniature sandblast unit. Crushed glass with average particle size of 50 micrometers was directed at the coated and uncoated specimens at an angle of 90° for 10 minutes using the test procedure summarized in Table 3. The erosion performance of uncoated and coated specimens was determined based upon weight loss as well as calculated volume loss in 10 minutes.

AM-350 stainless steel specimens uncoated and coated in Examples 3C, 4F and 5C with W+W$_3$C, W+W$_2$C+W$_3$C and W+W$_2$C coatings, respectively, were tested for erosion performance. The test results summarized in Table 4 indicated that coated specimens outperformed uncoated specimen both on weight loss basis as well as volume loss basis. Surprisingly, the erosion performance of W+W$_2$C+W$_3$C coating was far superior to that of W+W$_3$C coating (see Table 4). Additionally, erosion performance of W+W$_2$C coating was considerably better than that of W+W$_2$C+W$_3$C and W+W$_3$C coatings.

This Example, therefore, shows that coatings described in this application provide good erosion and wear protection. Additionally, the degree of erosion and wear protection required can be manipulated by altering the coating composition.

Example 14

The wear performance of W+W$_2$C coating was determined using a block-on-ring test. The test machine was made by Falex Corporation, Aurora, Illinois. The wear performance of uncoated 4620 steel rings was determined against coated and uncoated 440C steel blocks. The test was conducted in a mineral oil having a viscosity of 62.5 centipoise. The oil contained 3.0 μm alumina particles in a concentration of 2 gm/litre. The block-on-ring test was performed using a load of 250 lb. and 90° oscillating motion at 60 rpm for 20,000 cycles. Wear scar width and weight loss were measured to determine and compare the wear performance of coated and uncoated specimens.

The test results summarized in Table 5 indicated that the coated block outperformed the uncoated block both on the basis of wear scar on the ring and weight loss by the ring.

This example, therefore, shows that tungsten/carbon alloy coatings described in the present invention provide good wear protection.

Example 15

The wear performance of W+W$_2$C coating was once again determined using a pin-on-disc test. The test machine was made by Falex Corporation. The wear performance of uncoated and coated 440C steel pins was determined against uncoated SiC disc. The test was conducted in a mineral oil having a viscosity of 62.5 centipoise. It contained 3.0 μm alumina in a concentration of 2 gm/liter. The pin-on-disc test was conducted using a load of 4 lbs and continuous motion at 150 rpm. The wear performance of the coated and the uncoated 440C steel pins was compared based upon the pin wear rate.

The test results summarized in Table 6 indicated that the coated 440C steel pin outperformed the uncoated pin; the pin wear rate on the coated specimen was ~18.5 times lower than the uncoated specimen despite running it more than two times longer distance.

This example shows that tungsten/carbon alloy coatings discussed in this application provide good wear protection.

Example 16

Several Am-350, SS-422 and IN-718 specimens are coated in an inductively heated graphite reactor similar to that described in earlier examples. A reaction temperature of 445° C., a total pressure of 40 Torr and flow rate of 300 cc/min. WF$_6$, 3,000 cc/min. hydrogen and 20 cc/min. of diethyl ether (DEE) are used for the reaction and at a reaction time of 50 minutes. These conditions provide WF$_6$/DEE ratio, W/C atomic ratio and DEE partial pressure of 15.0, 3.75, and 0.24 Torr, respectively. A H$_2$/WF$_6$ ratio of 10.0 is maintained during the run. Based on the previous examples set forth above, all of the specimens are expected to be coated with a bright, smooth, adherent, coherent, and uniform coating of ~20 μm thick on each side. The coating is expected to be free of columnar grains and a mixture of W and W$_3$C phases.

Example 17

CVD experiment described in Example 16 is repeated with using 40 cc/min. DEE instead of 20 cc/min. The increase in DEE flow rate causes a decrease in WF$_6$/DEE ratio to 7.5, a decrease in W/C atomic ratio to 1.88, and an increase in DEE partial pressure to 0.48 Torr. All the other reaction conditions are maintained the same as described in Example 16. All the specimens are expected to be coated with a bright, smooth, adherent, coherent, and uniform coating of ~15 μm thick on each side. The coating is expected to be free of columnar grains and a mixture of W and W$_2$C phases.

Example 18

Several AM-350, SS-422 and In-718 specimens are coated in an inductively heated graphite reactor similar to that described in earlier examples. A reaction temperature of 445° C., total pressure of 40 Torr. and flow rate of 33 cc/min. WF$_6$, 3,000 cc/min. hydrogen and 40 cc/min. of ethanol are used for the reaction. Reaction time used is 50 min. These conditions provide WF$_6$/ethanol ratio, W/C atomic ratio and ethanol partial pressure of 7.5, 3.75 and 0.48 Torr, respectively. A H$_2$/WF$_6$ ratio of 10.0 is also used during the reaction. All the specimens are expected to be coated with a bright, smooth, adherent, coherent, and uniform coating of ~20 μm thick on each side. The coating is expected to be free of columnar grains and a mixture of W and W$_3$C phases.

Example 19

CVD experiment described in Example 18 is repeated with using 80 cc/min. ethanol instead of 40 cc/min. The increase in ethanol flow rate causes a decrease in WF$_6$/ethanol ratio to 3.75, a decrease in W/C atomic ratio to 1.88, and an increase in ethanol partial pressure to 0.95 Torr. All the other reaction conditions are maintained the same as described in Example 3. All the specimens are expected to be coated with a bright, smooth, adherent, coherent, and uniform coating and ~15 μm thick on each side. The coating is expected to be free of columnar grains and a mixture of W and W$_2$C phases.

Example 20

CVD experiment described in Example 3 is repeated again with using 80 cc/min. methanol instead of 40 cc/min. of ethanol. This flow rate of methanol results in WF$_6$/methanol ratio, W/C atomic ratio, and methanol partial pressure of 3.75, 3.75, and 0.95 Torr, respectively. All the other reaction conditions are maintained the same as described in Example 18. All the specimens are expected to be coated with a brigh, smooth, adherent, coherent, and uniform coating of ~20 μm thick on each side. The coating is expected to be free of columnar grains and a mixture of W and W$_3$C phases.

EXPERIMENTAL

X-RAY Diffraction (XRD) Instrumental Apparatus and Experimental Procedures

Diffraction experiments were performed using a manually-controlled Siemens D500 and, in a few cases, a Philips APD 3720. For most scans on the Siemens and all scans on the Philips, graphite-monochromatized CuKα radiation ($\lambda = 1.54178$Å) was employed; for some scans on the Siemens, vanadium-filtered CrKα radiation ($\lambda = 2.29092$Å) was used. The Siemens had a 1° fixed divergence slit, 1° scatter slits, a soller slit in the diffracted beam, a 0.15° detector slit, and, for CuKα radiation, a 0.15° slit in the diffracted beam monochromator. The Philips had a variable divergence slit which kept the sample illumination length fixed at 13.2 mm. Both instruments had scintillation x-ray detectors. Data output for the Siemens was by strip-chart recording; that for the Philips was in the form of digitized diffraction traces which were stored in files in a dedicated Micro PDP 11-23 computer.

The volume of sample illuminated by x-rays varied with the type of diffractometer and radiation employed. The Siemens illumination area decreased as the diffraction angle (2θ) increased, while the Philips illumination area was constant and independent of 2θ. The penetration depth is a function of x-ray wavelength, the linear absorption coefficient of the sample, and diffraction angle. A rough calculation showed that 99% of CuKα diffracted intensity for a reflection whose d-spacing was 2.25Å (2θ~40°) came from the top ~2.5 μm of these tungsten-rich materials. The corresponding penetration depth for CrKα radiation was ~1.3 μm. The region between 1.3 μm and 2.5 μm, which effectively could not be probed by CrKα x-rays, accounted for ~10% of the total CuKα diffracted intensity.

Diffraction scans were made for the purpose of phase identification and, in some cases, for measuring cyrstallite size. Survey scans over wide angular regions (usually, 5°–90° for CuKα and 15°–115° for CrKα) at rapid scan rates (5°/min. or 2°/min.) were initially obtained. If there was some doubt about the presence of a weakly-diffracting phase, scans were repeated at a slower (1°/min.) scan rate. d-spacings were calculated employing the Bragg equation:

$$\lambda = 2d \sin \theta. \tag{1}$$

Relative intensities were taken directly from the strip-chart recordings (Siemens) or plotted diffraction traces (Philips).

Phases were identified manually by comparing observed d-spacings and relative intensities with those found in Powder Diffraction File (PDF) cards 2-1134 (W$_2$C), 2-1138 (W$_3$C)*, and 4-806 (W). Due to preferred crystallite orientation, more attention was paid to the positions of lines than to their intensities.

* PDF card 2-1138 is actually for W$_3$O. W$_3$c and W$_3$O are structurally isomorphous. To determine whether the coating consists of W+W$_3$C or W+W$_3$O, an Auger Emission Spectra (AES) depth profile was performed on a CVD produced tungsten/carbon alloy coating. Within the detection limits of the technique (>0.1 atomic percent) no oxygen was observed within the coating depth of ~3600Å that was profiled. However, approximately 5.3 atomic percent carbon was observed within the depth profiled, indicating that the coating consisted of W+W$_3$C rather than W+W$_3$O.

Certain isolated peaks in the scans were rescanned slowly (½°/min. or 1°/min.) for the purpose of estimating crystallite size. The crystallite size is given by the Scherrer equation:**

$$\text{Crystallite Size} = \frac{c\lambda}{\beta \cos \theta}, \tag{2}$$

where c is a constant set to 0.9 and $$\beta = (\beta_1^2 - \beta_0^2)^{\frac{1}{2}}, \tag{3}$$

where $\beta_1$ is the full width at half-maximum (FWHM) of the observed diffraction line and $\beta_o$ is the FWHM of a diffraction line of a highly-crystalline reference material. The reference material used was Linde C alumina. $\beta_o$ was obtained by linear interpolation between the FWHM's of reference diffraction lines whose θ-values spanned that of the observed line.

** B. D. Cullity, "Elements of X-ray Diffraction" (Reading, Mass: Addison-Wesley, 1978), p. 284

Interpretation of XRD Results

Based on phase composition, the materials can be divided into three groups. Some were binary mixtures of W and $W_3C$; some were ternary mixtures of W, $W_3C$ and $W_2C$; and still others were binary mixtures of W and $W_2C$. The crystallite sizes were uniformly small, almost always less than 200Å and often less than 100Å.

Figure 11:
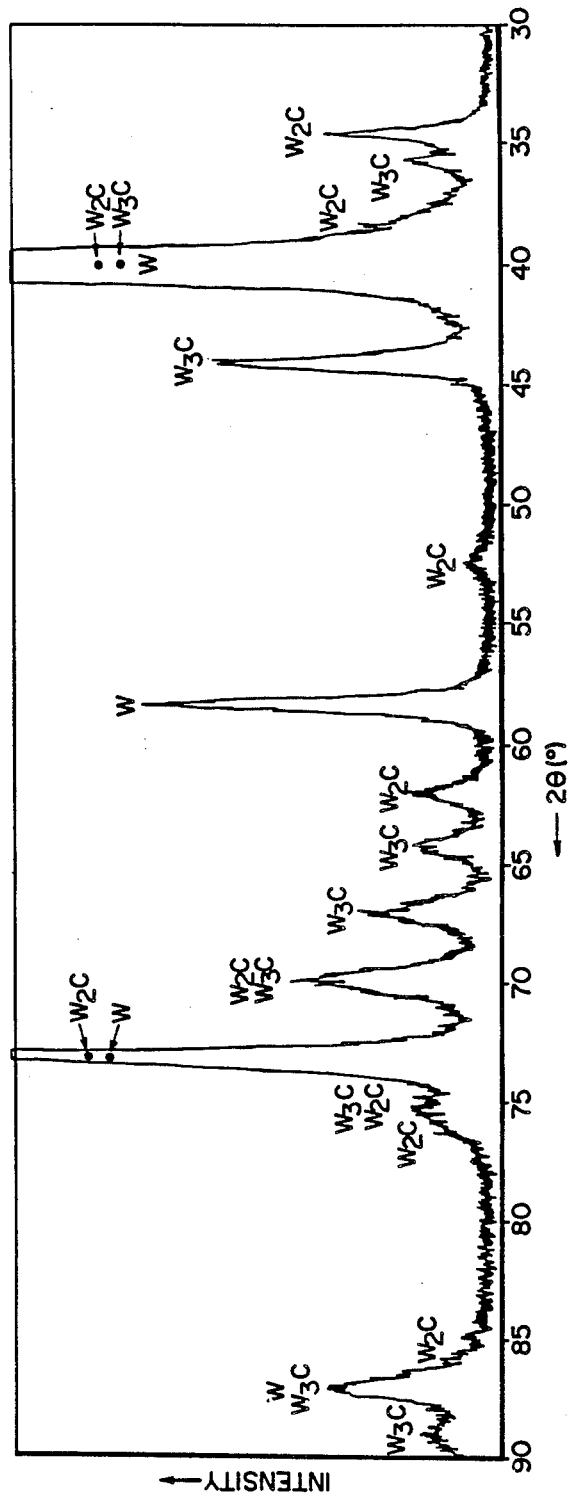
FIG. 11 is an x-ray diffraction scan of a sample containing W, $W_2C$ and $W_3C$ phases.
Figure 12:
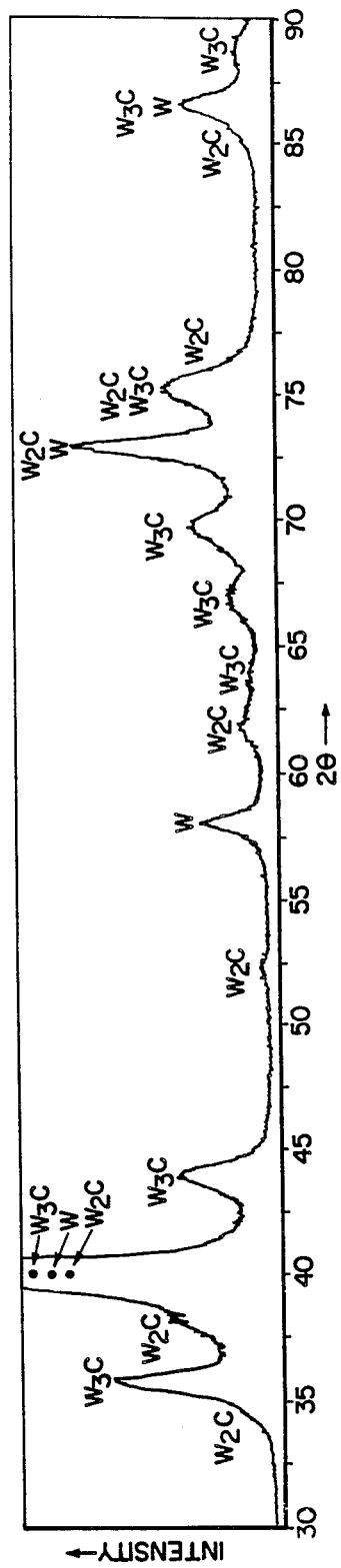
FIG. 12 is an x-ray diffraction scan of a sample containing W, $W_3C$ and a trace amount of $W_2C$ phases.
Figure 13:
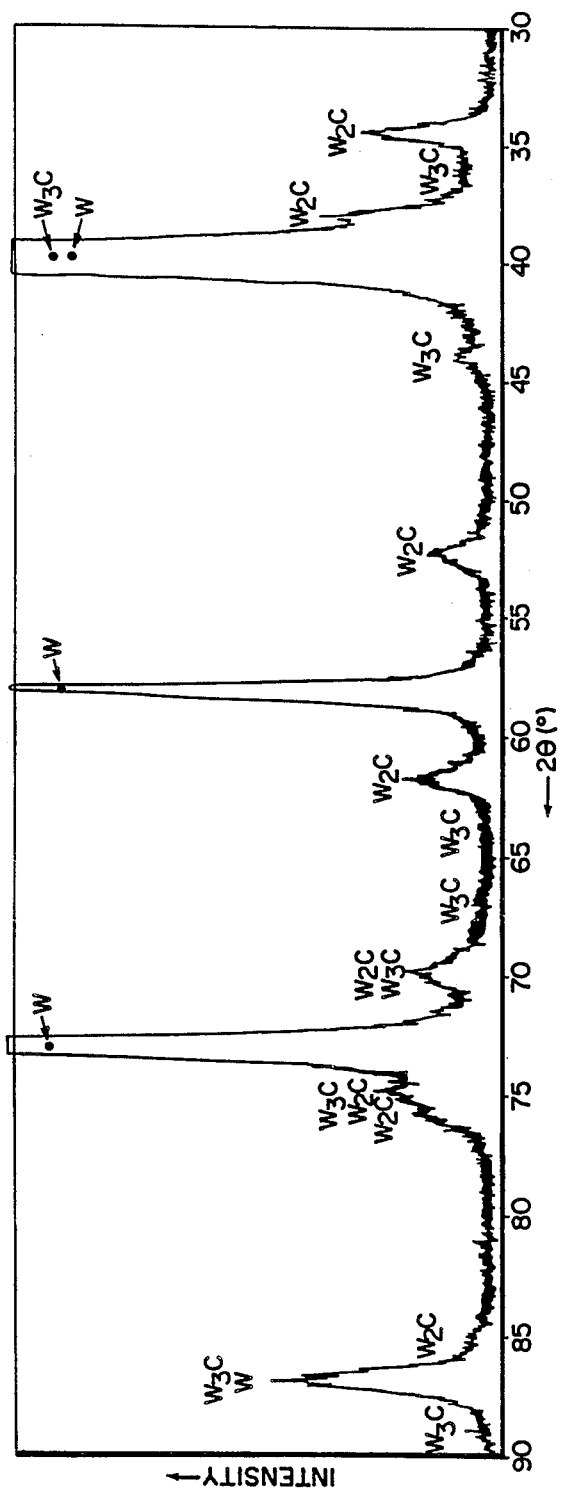
FIG. 13 is an x-ray diffraction scan of a sample containing W, $W_2C$ and a trace amount of $W_3C$ phases.
Figure 14:
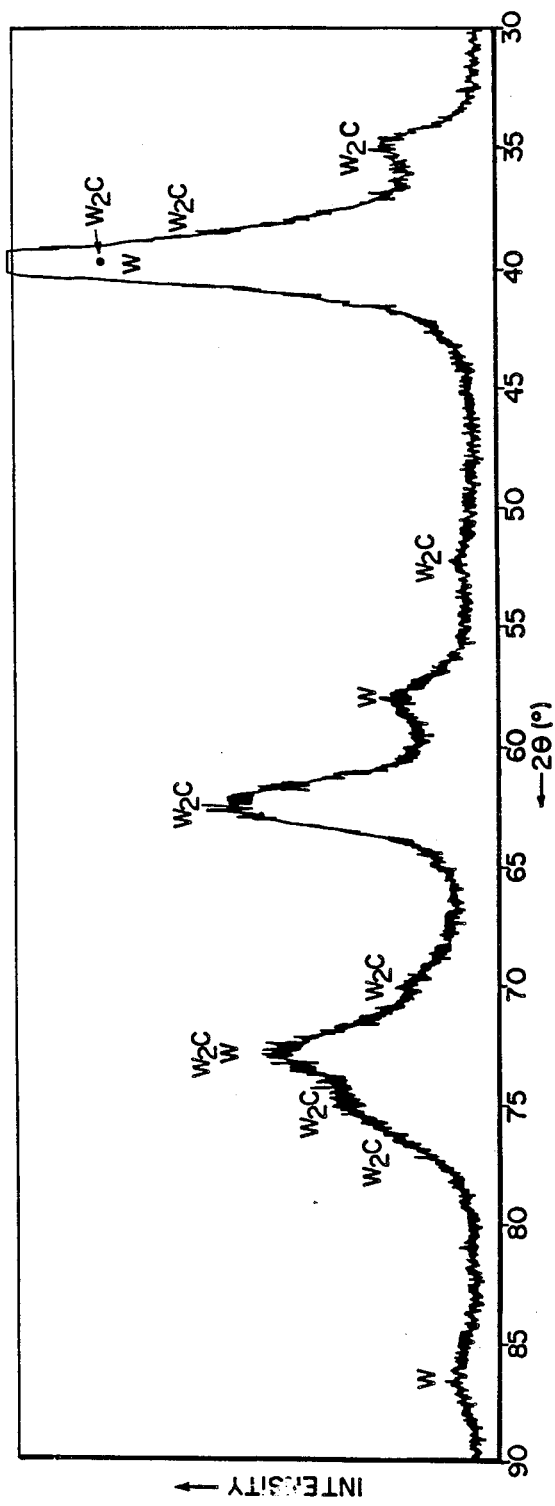
FIG. 14 is an x-ray diffraction scan of a sample containing W and $W_2C$ phases.
Figure 15:
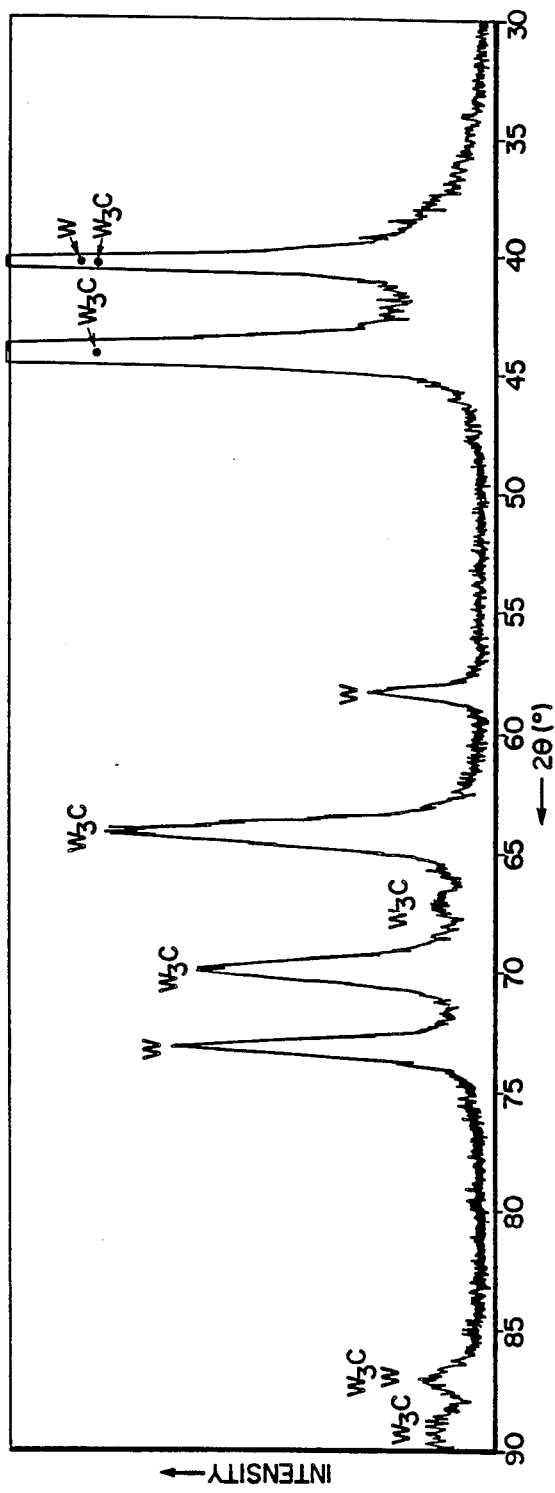
FIG. 15 is an x-ray diffraction scan of a sample containing $W+W_3C$ phases.

FIG. 11 is a Siemens CuKα scan of a W/$W_3C$/$W_2C$ mixture. This pattern is rather more crystalline than the average, and shows clearly that all three phases are present. FIG. 12 is a Siemens CuKα scan of a ternary mixture, but in this case a trace amount of $W_2C$ is present in the sample. FIG. 13 is a Siemens CuKα scan of a ternary mixture and here a trace amount of $W_3C$ is present in the sample. FIG. 14 is a Siemens CrKα scan of a very low-crystalline, almost amorphous W/$W_2C$ mixture. FIG. 15 is a typical scan of a W/$W_3C$ mixture. No $W_2C$ was detected in this scan.

TABLE 1

Example 1

| | | | |
|---|---|---|---|
| Substrate | SiC-6 Graphite | AM-350 Stainless Steel | |
| Temperature, °C. | 443 | 443 | |
| Pressure, Torr. | 40 | 40 | |
| Deposition Time, Min. | 40 | 40 | |
| Flow Rates, Std. cc/min | | | |
| WF$_6$ | 300 | 300 | |
| H$_2$ | 3,000 | 3,000 | |
| DME | — | — | |
| Argon | — | — | |
| H$_2$/WF$_6$ Ratio | — | — | |
| WF$_6$/DME Ratio | — | — | |
| DME partial pressure, Torr | — | — | |
| W/C Atomic Ratio | — | — | |
| Coating Thickness, μm | 12–40 | 12–50 | |
| Vickers Hardness, Kg/mm$^2$ | 510 ± 23 | 465 ± 49 | |

Example 2

| | A | B | C | D | E |
|---|---|---|---|---|---|
| Substrate | IN-718 | AM-350 | AM-350 | AM-350 | SS-422 |
| Temperature, °C. | 443 | 443 | 443 | 443 | |
| Pressure, Torr. | 40 | 40 | 40 | 40 | |
| Deposition Time, Min. | 15 | 15 | 40 | 20 | |
| Flow Rates, Std. cc/min | | | | | |
| WF$_6$ | 300 | 300 | 300 | 300 | |
| H$_2$ | 3,000 | 3,000 | 3,000 | 3,000 | |
| DME | — | 55 | 60 | 62 | |
| Argon | 4,000 | 300 | 300 | 300 | |
| H$_2$/WF$_6$ Ratio | 10 | 10 | 10 | 10 | |
| WF$_6$/DME Ratio | — | 5.45 | 5.00 | 4.84 | |
| DME partial pressure, Torr | — | 0.60 | 0.66 | 0.68 | |
| W/C Atomic Ratio | — | 2.73 | 2.50 | 2.42 | |
| Coating Thickness, μm | 10–12 | 5 | 12 | 5 | |
| Vickers Hardness, Kg/mm$^2$ | 564 ± 25 | 2179 ± 29 | 2224 ± 46 | 455 ± 50 | 511 ± 54 |

Example 3

| | A | B | C | D | E | F | G | H | I |
|---|---|---|---|---|---|---|---|---|---|
| Substrate | AM-350 | AM-350 | SiC-6 Graphite | AM-350 | AM-350 | AM-350 | AM-350 | SiC-6 Graphite | AM-350 |
| Temperature, °C. | 440 | 442 | 447 | 443 | 443 | 443 | 431 | 371 | 445 |
| Pressure, Torr. | 40 | 40 | 40 | 40 | 40 | 40 | 40 | 40 | 40 |
| Deposition Time, Min. | 40 | 30 | 35 | 30 | 30 | 30 | 30 | 20 | 40 |
| Flow Rates, Std. cc/min | | | | | | | | | |
| WF$_6$ | 300 | 300 | 300 | 300 | 300 | 300 | 300 | 350 | 300 |
| H$_2$ | 3,000 | 3,000 | 3,000 | 3,000 | 3,000 | 3,000 | 3,000 | 3,500 | 3,300 |
| DME | 40 | 40 | 40 | 30 | 40 | 50 | 50 | 65 | 60 |
| Argon | — | — | — | 300 | — | 300 | 300 | — | — |
| H$_2$/WF$_6$ Ratio | 10 | 10 | 10 | 10 | 10 | 10 | 10 | — | 11 |
| WF$_6$/DME Ratio | 7.50 | 7.50 | 7.50 | 10 | 7.5 | 6.0 | 6.0 | 5.38 | 5.00 |
| DME partial pressure, Torr | 0.48 | 0.48 | 0.48 | 0.33 | 0.44 | 0.55 | 0.55 | 0.66 | 0.66 |
| W/C Atomic Ratio | 3.75 | 3.75 | 3.75 | 5.00 | 3.75 | 3.00 | 3.00 | 2.69 | 2.50 |
| Coating Thickness, μm | 22 | 15 | 16 | 15 | 10 | 12 | 8 | 6 | 14 |
| Vickers Hardness, Kg/mm$^2$ | 2414 ± 69 | 2395 ± 15 | — | 2395 ± 15 | 2361 ± 105 | — | — | — | — |

Example 4

| | G | H | I | J | K |
|---|---|---|---|---|---|
| Substrate | SiC-6 Graphite | SiC-6 Graphite | SiC-6 Graphite | SiC-6 Graphite | SiC-6 Graphite |
| Temperature, °C. | 462 | 467 | 467 | 474 | 477 |
| Pressure, Torr. | 40 | 40 | 40 | 50 | 100 |
| Deposition Time, Min. | 40 | 40 | 40 | 40 | 15 |
| Flow Rates, Std. cc/min | | | | | |
| WF$_6$ | 300 | 300 | 300 | 300 | 400 |
| H$_2$ | 3,000 | 3,000 | 3,000 | 3,000 | 4,000 |
| DME | 70 | 40 | 35 | 35 | 24 |
| Argon | — | — | — | — | — |
| H$_2$/WF$_6$ Ratio | 10 | 10 | 10 | 10 | 10 |
| WF$_6$/DME Ratio | 4.29 | 7.50 | 8.57 | 8.57 | 16.7 |
| DME partial pressure, Torr | 0.83 | 0.48 | 0.42 | 0.52 | 0.54 |
| W/C Atomic Ratio | 2.15 | 3.75 | 4.28 | 4.28 | 8.35 |
| Coating Thickness, μm | 13 | 22 | 21 | 22 | 20 |
| Vickers Hardness, Kg/mm$^2$ | 2241 ± 71 | — | — | — | 1657 ± 122 |

Example 5

| | A | B | C | D | E | F | G | H | I | J | K | L | M | N |
|---|---|---|---|---|---|---|---|---|---|---|---|---|---|---|
| Substrate | SiC-6 Graphite | AM-350 | AM-350 | AM-350 | AM-350 | AM-350 | AM-350 | AM-350 | AM-350 | AM-350 | AM-350 | AM-350 | AM-350 | AM-350 |
| Temperature, °C. | 477 | 463 | 443 | 443 | 440 | 445 | 445 | 445 | 445 | 445 | 445 | 443 | 445 | 445 |
| Pressure, Torr. | 100 | 40 | 40 | 40 | 40 | 40 | 40 | 40 | 40 | 40 | 40 | 40 | 40 | 40 |
| Deposition Time, Min. | 15 | 50 | 35 | 20 | 20 | 70 | 30 | 40 | 40 | 90 | 40 | 40 | 90 | 80 |
| Flow Rates, Std. cc/min | | | | | | | | | | | | | | |
| WF$_6$ | 400 | 300 | 300 | 300 | 3,000 | 300 | 300 | 300 | 300 | 300 | 300 | 300 | 200 | 200 |
| H$_2$ | 4,000 | 3,000 | 3,000 | 3,000 | 3,000 | 3,000 | 3,000 | 3,000 | 3,000 | 3,000 | 3,000 | 3,000 | 2,400 | 2,400 |
| DME | 65 | 85 | 85 | 85 | 90 | 85 | 90 | 90 | 100 | 90 | 80 | 70 | 60 | 60 |
| Argon | — | — | — | 300 | 300 | — | 300 | 300 | 300 | 300 | 300 | 300 | 6,000 | 6,000 |
| H$_2$/WF$_6$ Ratio | 10 | 10 | 10 | 10 | 10 | — | 10 | 10 | 10 | 10 | 10 | 10 | 12 | 12 |
| WF$_6$/DME Ratio | 6.15 | 3.53 | 3.53 | 3.53 | 3.33 | 3.53 | 3.33 | 3.33 | 3.00 | 3.33 | 3.75 | 4.29 | 3.33 | 3.33 |
| DME partial pressure, Torr | | | | | | | | | | | | | 0.28 | 0.28 |
| W/C Atomic Ratio | | | | | | | | | | | | | 1.67 | 1.67 |
| Coating Thickness, μm | | | | | | | | | | | | | 12 | 12 |
| Vickers Hardness, Kg/mm$^2$ | | | | | | | | | | | | | 2,422 | 2,341 |

TABLE 1-continued

| | N | O | P | Q | R | S | T | U | V | W | X | Y | Z |
|---|---|---|---|---|---|---|---|---|---|---|---|---|---|
| DME partial pressure, torr | 1.45 | 1.00 | 1.00 | 0.92 | 0.97 | 1.00 | 0.97 | 0.97 | 1.08 | 0.97 | 0.87 | 0.76 | 0.76 |
| W/C Atomic Ratio | 3.08 | 1.76 | 1.76 | 1.76 | 1.67 | 1.76 | 1.67 | 1.67 | 1.50 | 1.67 | 1.88 | 2.15 | 2.15 |
| Coating Thickness, μm | 25 | 25 | 20 | 8 | Not Determined | 27 | 8 | 12 | 14 | 12 | 12 | 10 | 6 |
| Vickers Hardness, Kg/mm$^2$ | 2512 ± 119 | 2758 ± 77 | — | 2746 ± 51 | — | 2758 ± 31 | 2660 ± 30 | 2851 ± 66 | 3054 ± 156 | 2836 ± 188 | 2758 ± 15 | 2434 ± 102 | 2857 ± 173 |

Example 5

| | N | O | P | Q | R | S | T | U | V | W | X | Y | Z |
|---|---|---|---|---|---|---|---|---|---|---|---|---|---|
| Substrate | AM-350 | AM-350 | AM-350 | AM-350 | AM-350 | AM-350 | AM-350 | AM-350 | AM-350 | AM-350 | AM-350 | AM-350 | AM-350 |
| Temperature, °C. | 431 | 454 | 454 | 442 | 434 | 421 | 443 | 445 | 445 | 445 | 445 | 445 | 445 |
| Pressure, Torr. | 40 | 40 | 40 | 40 | 40 | 40 | 40 | 40 | 40 | 40 | 40 | 40 | 40 |
| Deposition Time, Min. | 30 | 30 | 30 | 40 | 80 | 115 | 85 | 65 | 90 | 150 | 180 | 100 | 130 |
| Flow Rates, Std. cc/min | | | | | | | | | | | | | |
| WF$_6$ | 300 | 300 | 300 | 300 | 300 | 300 | 300 | 300 | 200 | 100 | 100 | 200 | 200 |
| H$_2$ | 3,000 | 3,000 | 3,000 | 3,000 | 3,000 | 3,000 | 3,000 | 3,000 | 2,000 | 1,000 | 1,000 | 1,600 | 1,200 |
| DME | 90 | 70 | 90 | 90 | 90 | 90 | 90 | 90 | 60 | 30 | 30 | 60 | 60 |
| Argon | 300 | 300 | 300 | 1,500 | 1,500 | 1,800 | 1,500 | 1,800 | 3,500 | 5,000 | 4,000 | 4,000 | 4,500 |
| H$_2$/WF$_6$ Ratio | 10 | 10 | 10 | 10 | 10 | 10 | 10 | 10 | 10 | 10 | 10 | 8 | 6 |
| WF$_6$/DME Ratio | 3.33 | 4.29 | 3.33 | 3.33 | 3.33 | 3.33 | 3.33 | 3.33 | 3.33 | 3.33 | 3.33 | 3.33 | 3.33 |
| DME partial pressure, Torr | 0.97 | 0.76 | 0.97 | 0.74 | 0.74 | 0.69 | 0.74 | 0.69 | 0.42 | 0.19 | 0.23 | 0.41 | 0.40 |
| W/C Atomic Ratio | 1.67 | 2.15 | 1.67 | 1.67 | 1.67 | 1.67 | 1.67 | 1.67 | 1.67 | 1.67 | 1.67 | 1.67 | 1.67 |
| Coating Thickness, μm | 6.4 | 8 | 3 | 6 | 13 | 17 | 19 | 13 | 9 | 9 | 9 | 9 | 10 |
| Vickers Hardness, Kg/mm$^2$ | 2897 ± 15 | 3210 ± 15 | — | — | 2469 ± 53 | 2470 ± 53 | 2472 ± 110 | 2398 ± 109 | 2,035 | 2,315 | 2,167 | 2,100 | 2,289 |

TABLE 2

Coating Composition

| | Example 1 | Example 2 | Example 3 A | B | C | D | E | F | G | H | I |
|---|---|---|---|---|---|---|---|---|---|---|---|
| Composition | | | | | | | | | | | |
| W | Major | Major | Minor | Minor | Minor | Minor | Minor | Major | Major | Major | Major |
| $W_2C$ | None | None | None | None | None | None | None | None | None | None | None |
| $W_3C$ | None | None | Major | Major | Major | Major | Major | Minor | Major | Major | Major |
| Crystallite Size, Å | | | | | | | | | | | |
| W | — | — | — | — | 102 | 140 | 140 | 181 | 124 | — | 95 |
| $W_2C$ | — | — | — | — | — | — | — | — | — | — | — |
| $W_3C$ | — | — | — | — | 92 | 111 | 119 | 86 | 87 | — | 61 |

| Example 4 | A | B | C | D | E | F | G | H | I | J | K | L | M | N |
|---|---|---|---|---|---|---|---|---|---|---|---|---|---|---|
| Composition | | | | | | | | | | | | | | |
| W | Major | Major | Major | Major | Major | Major | Major | Major | Major | Major | Major | Major | Major | Major |
| $W_2C$ | Major | Trace | Trace | Major | Trace | Minor | Major | Trace | Trace | Major | Trace | Minor | Trace | Trace |
| $W_3C$ | Major | Major | Major | Minor | Major | Major | Trace | Major | Minor | Major | Minor | Minor | Minor | Minor |
| Crystallite Size, Å | | | | | | | | | | | | | | |
| W | — | — | 80 | 138 | — | 164 | 150 | — | — | — | — | 100 | 128 | 134 |
| $W_2C$ | — | — | 52 | — | — | 86 | — | — | — | — | — | 83 | — | — |
| $W_3C$ | — | — | — | 107 | — | 73 | 120 | — | — | — | — | 48 | 74 | 74 |

| Example 5 | A | B | C | D | E | F | G | H | I | J | K | L |
|---|---|---|---|---|---|---|---|---|---|---|---|---|
| Composition | | | | | | | | | | | | |
| W | — | Minor | Minor | Major | Major | Major | Major | Major | Major | Major | Major | Major |
| $W_2C$ | Minor | Major | Major | Major | Major | Major | Major | Major | Major | Major | Major | Major |
| $W_3C$ | None | None | None | None | None | None | None | None | None | None | None | None |
| Crystallite Size, Å | | | | | | | | | | | | |
| W | — | ≦50 | ≦50 | — | ≦50 | ≦50 | ≦50 | ≦50 | ≦50 | ≦50 | ≦50 | ≦50 |
| $W_2C$ | — | ≦50 | ≦50 | — | ≦50 | ≦50 | ≦50 | ≦50 | ≦50 | ≦50 | ≦50 | ≦50 |
| $W_3C$ | — | — | — | — | — | — | — | — | — | — | — | — |

| Example 5 | M | N | O | P | Q | R | S | T | U | V | W | X | Y | Z |
|---|---|---|---|---|---|---|---|---|---|---|---|---|---|---|
| Composition | | | | | | | | | | | | | | |
| W | Major | Major | Major | Major | Major | Major | Major | Major | Major | Major | Major | Major | Major | Major |
| $W_2C$ | Minor | Minor | Minor | Minor | Trace | Minor | Trace | Minor | Minor | Minor | Minor | Minor | Minor | Major |
| $W_3C$ | None | None | None | None | None | None | None | None | None | None | None | None | None | None |
| Crystallite Size, Å | | | | | | | | | | | | | | |
| W | 83 | ≦50 | ≦50 | ≦50 | ≦50 | ≦50 | ≦50 | ≦50 | ≦50 | ≦50 | ≦50 | ≦50 | ≦50 | ≦50 |
| $W_2C$ | 58 | ≦50 | ≦50 | ≦50 | ≦50 | ≦50 | ≦50 | ≦50 | ≦50 | ≦50 | ≦50 | ≦50 | ≦50 | ≦50 |
| $W_3C$ | — | — | — | — | — | — | — | — | — | — | — | — | — | — |

Composition:
Concentration of W, $W_2C$ and $W_3C$ in the coating is determined based upon relative peak intensities of W, $W_2C$ and $W_3C$ phases.

Terms:
In Table 2, the term "Major" denotes a phase concentration exceeding 30 weight percent; the term "Trace" denotes a phase concentration less than 5 weight percent; the term "Minor" denotes a phase concentration varying between 5 and 30 weight percent; the term "None" denotes not detected.

TABLE 3

Erosion Test Procedure

| | |
|---|---|
| Nozzle Diameter | 0.045 inch |
| Stand Off Distance | 0.5 inch |
| Erosion Media | Crushed Glass (50 μm Average Particle Size) |
| Supply Pressure | 45 psig |
| Flow Rate of Erosion Media | 1.0 g/min |
| Erosion Test Standard | Weight Loss in 10 Minutes |

TABLE 4

Erosion Test Results

| Coating Composition | Weight Loss, g | Calculated Volume Loss, cc | Erosion Performance Relative to Uncoated AM-350 Stainless Steel Weight Basis | Volume Basis** |
|---|---|---|---|---|
| Uncoated AM-350 Stainless Steel Coated AM-350 | N/A | 0.00579 | $7.31 \times 10^{-4}$ | — | — |

TABLE 4-continued

| | | Erosion Test Results | | Erosion Performance Relative to Uncoated AM-350 Stainless Steel | |
|---|---|---|---|---|---|
| | Coating Composition | Weight Loss, g | Calculated Volume Loss, cc | Weight Basis | Volume Basis** |
| Stainless Steel | | | | | |
| Example 3C | W + $W_3C$ | 0.00042 | $2.63 \times 10^{-5}$ | 13.8 | 27.8 |
| Example 4F | W + $W_2C$ + $W_3C$ | 0.00016 | $1.00 \times 10^{-5}$ | 36.2 | 73.1 |
| Example 5C | W + $W_2C$ | 0.00010 | $0.63 \times 10^{-5}$ | 57.9 | 116 |

* $\frac{(\text{Weight loss})_{Uncoated\ specimen}}{(\text{Weight loss})_{Coated\ specimen}}$

** $\frac{(\text{Volume loss})_{Uncoated\ specimen}}{(\text{Volume loss})_{Coated\ specimen}}$

TABLE 5

Wear Test Results

| 440C Steel Block | 4620 Steel Ring | Wear Scar, mm | Weight Loss, mg | |
|---|---|---|---|---|
| | | | Ring | Block |
| Uncoated | Uncoated | 1.37 | 3.52 | 0.01 |
| Coated | Uncoated | 0.89 | 0.06 | 0.07 |
| Coated | Uncoated | 0.79 | 0.10 | 0.19 |

TABLE 6

Wear Test Results

| 440C Steel Pin | SiC Disc | Total Sliding Distance, cm $\times 10^5$ | Pin Wear Rate, $cm^3$/gm cm $\times 10^{-15}$ |
|---|---|---|---|
| Uncoated | Uncoated | 5.6 | 1.72 |
| Coated | Uncoated | 13.4 | 0.093 |

Conclusion

Thus it can be seen that the present invention discloses extremely hard, fine grained, non-columnar tungsten-carbon alloys which consist essentially of a mixture of a substantially pure tungsten phase and at least one carbide phase wherein the carbide phase consists of $W_2C$ or $W_3C$ or a mixture of $W_2C$ and $W_3C$. The new alloys are harder and more resistant to fracture, corrosion, erosion and wear than are tungsten-carbon alloys of the prior art that are produced by conventional chemical vapor deposition techniques and thus are composed of large columnar grains.

The present invention also discloses a method for producing the new tungsten-carbon alloys wherein the composition of the alloy's carbide phase can be controlled by controlling the temperature at which the reactions are run, the ratio of tungsten halide to oxygen- and hydrogen-containing organic compound and the ratio of hydrogen to tungsten halide. Thus the method makes it possible for those skilled in the art to produce custom alloys having desired carbide characteristics.

Various modifications of the invention in addition to those shown and described herein will become apparent to those skilled in the art from the foregoing description and examples. Such modifications are intended to fall within the scope of the appended claims.

What is claimed is:

1. A method for depositing a hard, fine-grained, non-columnar alloy of tungsten and carbon having a substantially lamellar or layered microstructure on a substrate, said alloy consisting essentially of a mixture of a tungsten phase and a carbide phase wherein said carbide phase is selected from the group consisting of (1) $W_2C$, (2) $W_3C$, and (3) a mixture of $W_2C+W_3C$, said method comprising the steps of: providing, in a chemical vapor deposition reactor, a mixture of process gases comprised essentially of (1) tungsten hexafluoride, (2) a volatile oxygen- and hydrogen-containing organic compound, and (3) hydrogen; controlling the ratio of said tungsten hexafluoride to said oxygen- and hydrogen-containing organic compound within said reactor so that the W/C atomic ratio is within the range of about 1 to about 6; controlling the reaction temperature so it is within the range of about 350° to about 550° C.; controlling the total pressure within the range of about 1 Torr. to about 1,000 Torr.; and controlling the ratio of $H_2$ to $WF_6$ within the range of about 4 to about 20 to produce W and $W_2C$, W and $W_3C$, or W and $W_2C$ and $W_3C$.

2. A method according to claim 1 wherein said oxygen- and hydrogen-containing organic compound is selected from the group consisting of $C_1$–$C_4$ alcohols and aldehydes, $C_2$–$C_4$ ethers, epoxides and ketenes and $C_3$–$C_4$ ketones.

3. A method according to claim 1 wherein said oxygen- and hydrogen-containing organic compound is dimethyl ether.

4. A method to claim 1 wherein the ratio of $H_2$ to $WF_6$ is within the range of about 5 to about 10.

5. A method according to claim 1 wherein said reaction temperature is controlled so it is within the range of about 400° C. to about 485° C.

6. A method according to claim 1 wherein said reaction pressure is controlled so it is within the range of about 20 to about 100 Torr.

7. A method according to claim 1 wherein said mixture of process gases further includes an inert gas selected from the group consisting of argon, nitrogen and helium.

8. A method for depositing a hard, fine-grained, non-columnar alloy of tungsten and carbon having a substantially lamellar or layered microstructure on a substrate, said alloy consisting essentially of a mixture of a tungsten phase and a carbide phase wherein said carbide phase is $W_2C$, said method comprising the steps of: providing, in a chemical vapor deposition reactor, a mixture of process gases comprised essentially of (1) tungsten hexafluoride, (2) a volatile oxygen- and hydrogen-containing organic compound containing from one to four carbon atoms, and (3) hydrogen; controlling the ratio of said tungsten halide to said oxygen- and hydrogen-containing organic compound within said reactor so that the W/C atomic ratio is within the range of about 1 to about 3.5; controlling the reaction temperature so it is within the range of about 350° to about 550° C.; controlling the reaction pressure so it is within the range of about 1 to 1000 Torr.; and controlling the ratio of $H_2$ to $WF_6$ within the range of about 4 to about 20 to produce W and $W_2C$.

9. A method according to claim 8 wherein said oxygen- and hydrogen-containing organic compound is selected from the group consisting of $C_1$–$C_4$ alcohols and aldehydes, $C_2$–$C_4$ ethers, epoxides and ketenes and $C_3$–$C_4$ ketones.

10. A method according to claim 8 wherein said oxygen- and hydrogen-containing organic compound is dimethyl ether.

11. A method to claim 8 wherein the ratio of $H_2$ to $WF_6$ is within the range of about 5 to about 10.

12. A method according to claim 8 wherein said reaction temperature is controlled so it is within the range of about 400° C. to about 485° C.

13. A method according to claim 8 wherein said reaction pressure is controlled so it is within the range of about 20 to about 100 Torr.

14. A method according to claim 8 wherein said mixture of process gases further includes an inert gas selected from the group consisting of argon, nitrogen and helium.

15. A method for depositing a hard, fine grained, non-columnar alloy of tungsten and carbon having a substantially lamellar or layered microstructure on a substrate, said alloy consisting essentially of a mixture of a tungsten phase and a carbide phase wherein said carbide phase is $W_3C$, said method comprising the steps of: providing, in a chemical vapor deposition reactor, a mixture of process gases comprised essentially of (1) tungsten hexafluoride, (2) a volatile oxygen- and hydrogen-containing organic compound containing from one to four carbon atoms, and (3) hydrogen; controlling the ratio of said tungsten halide to said oxygen- and hydrogen-containing organic compound within said reactor so that the W/C atomic ratio is within the range of about 2.5 to about 6; controlling the reaction temperature so it is within the range of about 350° to about 550° C.; controlling the reaction pressure so it is within the range of about 1 to 1000 Torr.; and controlling the ratio of $H_2$ to $WF_6$ within the range of about 4 to about 20 to produce W and $W_3C$.

16. A method according to claim 15 wherein said oxygen- and hydrogen-containing organic compound is selected from the group consisting of $C_1$–$C_4$ alcohols and aldehydes, $C_2$–$C_4$ ethers, epoxides and ketenes and $C_3$–$C_4$ ketones.

17. A method according to claim 15 wherein said oxygen- and hydrogen-containing organic compound is dimethyl ether.

18. A method to claim 15 wherein the ratio of $H_2$ to $WF_6$ is within the range of about 5 to about 10.

19. A method according to claim 15 wherein said reaction temperature is controlled so it is within the range of about 400° C. to about 485° C.

20. A method according to claim 15 wherein said reaction pressure is controlled so it is within the range of about 20 to about 100 Torr.

21. A method according to claim 15 wherein said mixture of process gases further includes an inert gas selected from the group consisting of argon, nitrogen and helium.

22. A method for depositing a hard, fine grained, non-columnar alloy of tungsten and carbon having a substantially lamellar or layered microstructure on a substrate, said alloy consisting essentially of a mixture of a tungsten phase and a carbide phase wherein said carbide phase is a mixture of $W_2C+W_3C$, said method comprising the steps of: providing, in a chemical vapor deposition reactor, a mixture of process gases comprised essentially of (1) tungsten hexafluoride, (2) a volatile oxygen- and hydrogen-containing organic compound containing from one to four carbon atoms, and (3) hydrogen; controlling the ratio of said tungsten halide to said oxygen- and hydrogen-containing organic compound within said reactor so said the W/C atomic ratio is within the range of about 2.0 to about 4.5; controlling the reaction temperature so it is within the range of about 350° to about 550° C.; controlling the reaction pressure so it is within the range of about 1 to 1000 Torr.; and controlling the ratio of $H_2$ to $WF_6$ within the range of about 4 to about 20 to produce W and $W_2C+W_3C$.

23. A method according to claim 22 wherein said oxygen- and hydrogen-containing organic compound is selected from the group consisting of $C_1$–$C_4$ alcohols and aldehydes, $C_2$–$C_4$ ethers, epoxides and ketenes and $C_3$–$C_4$ ketones.

24. A method according to claim 22 wherein said oxygen- and hydrogen-containing organic compound is dimethyl ether.

25. A method to claim 22 wherein the ratio of $H_2$ to $WF_6$ is within the range of about 5 to about 10.

26. A method according to claim 22 wherein said reaction temperature is controlled so it is within the range of about 400° C. to about 485° C.

27. A method according to claim 22 wherein said reaction pressure is controlled so it is within the range of about 20 to about 100 Torr.

28. A method according to claim 22 wherein said mixture of process gases further includes an inert gas selected from the group consisting of argon, nitrogen and helium.

* * * * *